United States Patent
Maeda

(10) Patent No.: US 9,136,304 B2
(45) Date of Patent: Sep. 15, 2015

(54) SOLID-STATE IMAGING DEVICE, SEMICONDUCTOR DEVICE, MANUFACTURING METHODS THEREOF, AND ELECTRONIC APPARATUS

(75) Inventor: Keiichi Maeda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 756 days.

(21) Appl. No.: 13/276,860

(22) Filed: Oct. 19, 2011

(65) Prior Publication Data

US 2012/0105696 A1    May 3, 2012

(30) Foreign Application Priority Data

Oct. 27, 2010  (JP) ................................. 2010-241491

(51) Int. Cl.
| | |
|---|---|
| H01L 27/146 | (2006.01) |
| H01L 21/768 | (2006.01) |
| H01L 23/48 | (2006.01) |
| H01L 23/552 | (2006.01) |
| H01L 25/065 | (2006.01) |

(52) U.S. Cl.
CPC ...... *H01L 27/1469* (2013.01); *H01L 21/76898* (2013.01); *H01L 23/481* (2013.01); *H01L 23/552* (2013.01); *H01L 25/0657* (2013.01); *H01L 27/1464* (2013.01); *H01L 27/14634* (2013.01); *H01L 27/14636* (2013.01); *H01L 27/14621* (2013.01); *H01L 27/14627* (2013.01); *H01L 2225/06513* (2013.01); *H01L 2225/06541* (2013.01); *H01L 2924/0002* (2013.01)

(58) Field of Classification Search
CPC ............ H01L 27/14636; H01L 23/481; H01L 23/552; H01L 25/0657; H01L 27/14634; H01L 27/1464; H01L 27/1469; H01L 21/76898; H01L 2225/06541

USPC .............. 348/294; 257/228, 444, 447; 438/74
See application file for complete search history.

(56) References Cited

U.S. PATENT DOCUMENTS

| | | | |
|---|---|---|---|
| 7,319,217 B2 | 1/2008 | Yoshihara et al. | |
| 2007/0285957 A1* | 12/2007 | Stobbs | 365/53 |
| 2009/0186480 A1* | 7/2009 | Goela et al. | 438/680 |
| 2010/0238331 A1* | 9/2010 | Umebayashi et al. | 348/294 |

FOREIGN PATENT DOCUMENTS

| | | |
|---|---|---|
| EP | 2 230 691 A2 | 9/2010 |
| JP | 2000-299379 | 10/2000 |
| JP | 2005-285988 | 10/2005 |
| JP | 2007-165750 | 6/2007 |
| JP | 2009-283482 | 5/2008 |
| JP | 4379295 | 10/2009 |
| JP | 2009-541990 | 11/2009 |
| JP | 2010-514177 | 4/2010 |

* cited by examiner

*Primary Examiner* — Paul Berardesca
(74) *Attorney, Agent, or Firm* — Dentons US LLP

(57) ABSTRACT

A solid-state imaging device includes an imaging element and a logic element. The imaging element includes a first semiconductor substrate, a first wiring layer, and a first metal layer, in which a pixel region which is a light sensing surface is formed. The logic element includes a second semiconductor substrate, a second wiring layer, and a second metal layer, in which a signal processing circuit that processes a pixel signal obtained at the pixel region is formed. The logic element is laminated to the imaging element so that the first metal layer and the second metal layer are bonded to each other, and the first metal layer and the second metal layer are formed on a region excluding a region in which a penetrating electrode layer penetrating a bonding surface of the imaging element and the logic element is formed.

20 Claims, 29 Drawing Sheets

151

1

1

SOLID-STATE IMAGING DEVICE, SEMICONDUCTOR DEVICE, MANUFACTURING METHODS THEREOF, AND ELECTRONIC APPARATUS

BACKGROUND

The present disclosure relates to a semiconductor device such as a solid-state imaging device, a manufacturing method thereof, and an electronic apparatus such as a camera including the solid-state imaging device.

In recent years, miniaturization and multilayering of inner wirings due to high integration of LSI (large-scale integrated circuits) have been proceeding. However, the high cost of a semiconductor manufacturing apparatus due to the miniaturization greatly affects the cost of LSI. In addition, a method which mixes and disposes a logic circuit, memory, an imaging device, or the like on single chip is performed. However, in order to perform the mixing and disposing while keeping process characteristics in each device to the maximum, complication and cost increase of the process may not be able to be avoided.

Under such circumstances, the following method is performed. That is, by bonding and laminating the single function LSIs (a logic circuit, memory, and an imaging element) with a wafer level and a chip level, a single chip is achieved without sacrificing the integration of the LSI having high performance. Consideration with respect to a configuration, which obtains electric conduction between laminated wafers or chips in a via in which insulating films are adhered and penetrated, has also been proceeding. However, when the semiconductor elements are close to each other, problems such as influence of electromagnetic waves generated by operation of mutual elements and crosstalk occur. In addition, malfunction due to heat generated by operation of mutual elements is also a problem.

Particularly, when an imaging element and an image processing element are laminated, problems such as an increase of dark current and increase of white noise in the imaging element due to heat generated by the operation of the image processing element occur. In addition, when a logic circuit (a metal wiring) is disposed under the imaging element, incident light is reflected at a wiring metal layer, the reflected light is returned to a photoelectric conversion region, and a problem which affects imaging performance also occurs.

As a method solving the above-described problems, in Japanese Patent No. 4379295, a configuration in which a conductive metal plate having a penetration electrode is interposed between mutual elements is suggested. However, in the configuration, problems such as an increase in the number of manufacturing steps and increase of the cost, a problem such as difficulty corresponding to miniaturization of the element, or a problem such as difficulty for application to bonding of wafer-to-wafer occur.

SUMMARY

Therefore, it is desirable to provide a manufacturing method capable of easily forming a shield layer between upper and lower elements in a semiconductor device or a solid-state imaging device in which elements having different functions are laminated and formed. In addition, it is desirable to provide a semiconductor device or a solid-state imaging device capable of decreasing influence of electromagnetic waves generated between upper and lower elements or influence of crosstalk. Moreover, it is desirable to provide an electronic apparatus using the solid-state imaging device.

According to an embodiment of the present disclosure, there is provided a solid-state imaging device including an imaging element and a logic element. The imaging element includes a first semiconductor substrate, a first wiring layer that is formed on a surface of the first semiconductor substrate, and a first metal layer that is formed on an upper portion of the first wiring layer, and a pixel region which is a light sensing surface is formed on a rear surface side of the first semiconductor substrate. The logic element includes a second semiconductor substrate, a second wiring layer that is formed on a surface of the second semiconductor substrate, and a second metal layer that is formed on an upper portion of the second wiring layer. In addition, a signal processing circuit that processes a pixel signal obtained at a pixel region is formed in the logic element. The imaging element and logic element are laminated to each other so that the first metal layer and the second metal layer are bonded to each other. In addition, the first metal layer and the second metal layer are formed on a region excluding a region in which a penetrating electrode layer penetrating a bonding surface of the imaging element and the logic element is formed.

According to another embodiment of the present disclosure, there is provided a semiconductor device including a first semiconductor element and a second semiconductor element. The first semiconductor element includes a first semiconductor substrate, a first wiring layer that is formed on a surface of the first semiconductor substrate, and a first metal layer that is formed on an upper portion of the first wiring layer, and a first semiconductor integrated circuit is formed. In addition, the second semiconductor element includes a second semiconductor substrate, a second wiring layer that is formed on a surface of the second semiconductor substrate, and a second metal layer that is formed on an upper portion of the second wiring layer, and a second semiconductor integrated circuit is formed. The first semiconductor element and second semiconductor element are laminated to each other so that the first metal layer and the second metal layer are bonded to each other. In addition, the first metal layer and the second metal layer are formed on a region excluding a region in which a penetrating electrode layer penetrating a bonding surface of the first semiconductor element and the second semiconductor element is formed.

In the solid-state imaging device or the semiconductor device of the embodiments of the present disclosure, both elements are laminated so that the first metal layer and the second metal layer formed on both laminated elements are bonded to each other. The first metal layer and second metal layer function as a shield layer due to the fact that they are bonded to each other. Thereby, influence of electromagnetic waves or influence of crosstalk between the laminated elements is decreased.

According to still another embodiment of the present disclosure, there is provided a manufacturing method of a solid-state imaging device including forming a first wiring layer on a surface of a first semiconductor substrate, forming a first metal layer in which a surface is exposed on an upper portion of the first wiring layer, and forming an imaging element including a pixel region. In addition, the manufacturing method includes forming a second wiring layer on a surface of a second semiconductor substrate, forming a second metal layer in which a surface is exposed on an upper portion of the second wiring layer, and forming a logic element having a signal processing circuit which processes a signal charge generated at a pixel region. In addition, the first metal layer and the second metal layer are formed on a region excluding a region in which a penetrating electrode layer penetrating a bonding surface of the imaging element and the logic element is formed. In addition, the manufacturing method includes laminating the imaging element and the logic element so that the first metal layer and the second metal layer are bonded to each other.

According to still another embodiment of the present disclosure, there is provided a manufacturing method of a semiconductor device including forming a first wiring layer on a surface of a first semiconductor substrate, forming a first metal layer in which the surface is exposed on an upper portion of the first wiring layer, and forming a first semiconductor element including a first semiconductor integrated circuit. In addition, the manufacturing method includes forming a second wiring layer on a surface of a second semiconductor substrate, forming a second metal layer in which a surface is exposed on an upper portion of the second wiring layer, and forming a second semiconductor element including a second semiconductor integrated circuit. In addition, the first metal layer and the second metal layer are formed on a region excluding a region in which a penetrating electrode layer penetrating a bonding surface of the first semiconductor element and the second semiconductor element is formed. In addition, the manufacturing method includes laminating the first semiconductor element and the second semiconductor element so that the first metal layer and the second metal layer are bonded to each other.

In the manufacturing method of the semiconductor device or the solid-state imaging device of the embodiments of the present disclosure, both elements can be laminated due to the fact that the first metal layer and the second metal layer formed on both elements are bonded to each other. Thereby, the laminating can be easily performed. In addition, the first metal layer and second metal layer function as a shield layer between the laminated elements. Thereby, influence of electromagnetic waves or influence of crosstalk between the laminated elements is decreased.

According to still another embodiment of the present disclosure, there is provided an electronic apparatus including an optical lens, a solid-state imaging device in which light focused at the optical lens is incident, and a signal processing circuit that processes an output signal output from the solid-state imaging device. The solid-state imaging device includes an imaging element and a logic element. The imaging element includes a first semiconductor substrate, a first wiring layer that is formed on a surface of the first semiconductor substrate, and a first metal layer that is formed on an upper portion of the first wiring layer, and a pixel region which is a light sensing surface is formed on a rear surface side of the first semiconductor substrate. The logic element includes a second semiconductor substrate, a second wiring layer that is formed on a surface of the second semiconductor substrate, and a second metal layer that is formed on an upper portion of the second wiring layer. In addition, a signal processing circuit that processes a pixel signal obtained at a pixel region is formed in the logic element. The imaging element and logic element are laminated to each other so that the first metal layer and the second metal layer are bonded to each other.

According to the embodiments of the present disclosure, in the semiconductor device or the solid-state imaging device on which the elements having different functions are laminated, the shield layer can be easily formed between the upper and lower elements, and influence of electromagnetic waves or problem of crosstalk generated between the upper and lower elements is decreased. In addition, the electronic apparatus having improved image quality is obtained by using the solid-state imaging device.

BRIEF DESCRIPTION OF THE DRAWINGS

FIG. 4A is a diagram illustrating a cross-section of an imaging element, and FIG. 4B is a diagram illustrating a cross-section of a logic element.

FIG. 5A is a diagram illustrating a cross-section of the imaging element, and FIG. 5B is a diagram illustrating a cross-section of the logic element.

FIG. 6A is a diagram illustrating a cross-section of the imaging element, and FIG. 6B is a diagram illustrating a cross-section of the logic element.

FIG. 7A is a diagram illustrating a cross-section of the imaging element, and FIG. 7B is a diagram illustrating a cross-section of the logic element.

FIG. 8A is a diagram illustrating a cross-section of the imaging element, and FIG. 8B is a diagram illustrating a cross-section of the logic element.

FIG. 13A is a diagram illustrating a cross-section of an imaging element, and FIG. 13B is a diagram illustrating a cross-section of a logic element.

FIG. 14A is a diagram illustrating a cross-section of the imaging element, and FIG. 14B is a diagram illustrating a cross-section of the logic element.

FIG. 15A is a diagram illustrating a cross-section of the imaging element, and FIG. 15B is a diagram illustrating a cross-section of the logic element.

FIG. 16A is a diagram illustrating a cross-section of the imaging element, and FIG. 16B is a diagram illustrating a cross-section of the logic element.

FIG. 18A is a diagram illustrating a cross-section of an imaging element, and FIG. 18B is a diagram illustrating a cross-section of a logic element.

FIG. 21A is a diagram illustrating a cross-section of an imaging element, and FIG. 21B is a diagram illustrating a cross-section of a logic element.

FIG. 23A is a diagram illustrating a cross-section of an imaging element, and FIG. 23B is a diagram illustrating a cross-section of a logic element.

FIG. 24A is a diagram illustrating a cross-section of the imaging element, and FIG. 24B is a diagram illustrating a cross-section of the logic element.

FIG. 30A is a diagram illustrating a cross-section of an imaging element, and FIG. 30B is a diagram illustrating a cross-section of a logic element.

DETAILED DESCRIPTION OF EMBODIMENTS

Hereinafter, examples of a solid-state imaging device and an electronic apparatus according to embodiments of the present disclosure will be described with reference to FIGS. 1 to 32. The embodiments of the present disclosure will be described according to the following order. In addition, the present disclosure is not limited to the examples described below.

Figure 1:
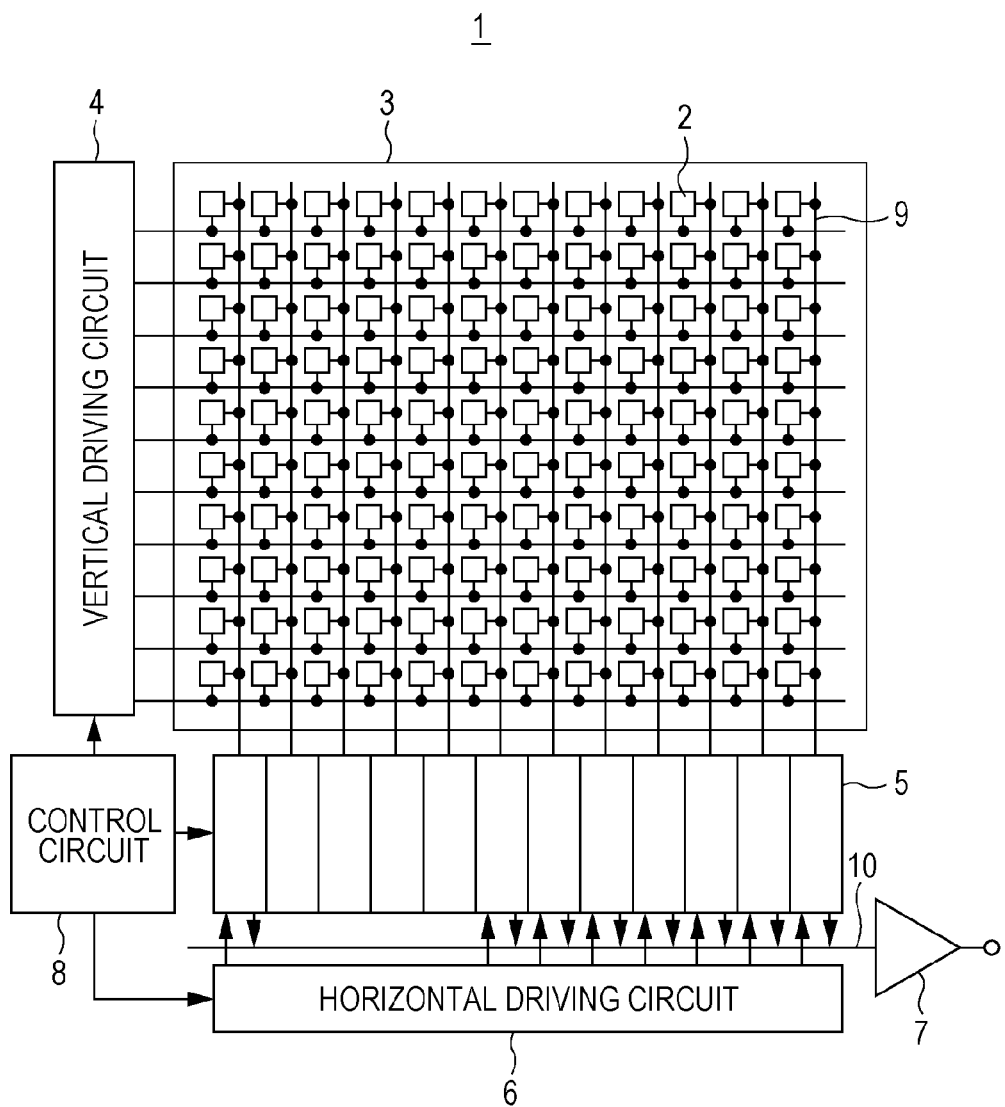
FIG. 1 is a diagram illustrating overall configuration of a solid-state imaging device according to a first embodiment of the present disclosure.

1. First Embodiment: MOS Type of Backside-Illuminated Solid-State Imaging Device
   1-1 Overall Configuration
   1-2 Cross-Sectional Configuration of Main Portion
   1-3 Manufacturing Method
2. Second Embodiment: MOS Type of Backside-Illuminated Solid-State Imaging Device
3. Third Embodiment: MOS Type of Backside-Illuminated Solid-State Imaging Device
4. Fourth Embodiment: MOS Type of Backside-Illuminated Solid-State Imaging Device
5. Fifth Embodiment: MOS Type of Backside-Illuminated Solid-State Imaging Device
6. Sixth Embodiment: MOS Type of Backside-Illuminated Solid-State Imaging Device
7. Seventh Embodiment: MOS Type of Backside-Illuminated Solid-State Imaging Device
8. Eighth Embodiment: MOS Type of Backside-Illuminated Solid-State Imaging Device
9. Ninth Embodiment: Electronic Apparatus 1. First Embodiment MOS Type of Backside-Illuminated Solid-State Imaging Device 1-1 Overall Configuration FIG. 1 is a diagram illustrating overall configuration of a MOS Type of a solid-state imaging device according to a first embodiment of the present disclosure. The MOS type of the solid-state imaging device is applied to the solid-state imaging device of each embodiment described below.

A solid-state imaging device 1 is constituted so as to include a pixel region (a so-called pixel array) 3 in which pixels 2 including a plurality of photoelectric conversion portions are regularly arranged in the form of a two-dimensional array on a semiconductor substrate (not illustrated), for example, a silicon substrate, and a periphery circuit portion. The pixels 2 include, for example, photodiodes which are used as photoelectric conversion portions, and a plurality of pixel transistors (so-called MOS transistors).

For example, a plurality of the pixel transistors may include three transistors including a transfer transistor, a reset transistor, and an amplification transistor. In addition, a plurality of the pixel transistors can include four transistors adding a selection transistor to the three transistors. In general, since equivalent circuits of a unit pixel are similar to each other, the detailed description is omitted. The pixel 2 may be constituted by a single unit pixel. In addition, the pixel 2 may be a shared pixel structure. The shared pixel structure is a structure in which a plurality of the photodiodes shares other transistors excluding a floating diffusion constituting the transfer transistor and the transfer transistor.

The periphery circuit portion is constituted so as to include a vertical driving circuit 4, a column signal processing circuit 5, a horizontal driving circuit 6, an output circuit 7, a control circuit 8, or the like.

The control circuit 8 receives data which commands an input clock, an operation mode, or the like, and outputs data such as an internal information of the solid-state imaging device. That is, the control circuit 8 generates a clock signal or a control signal and the like which are references of operation of the vertical driving circuit 4, the column signal processing circuit 5, and the horizontal driving circuit 6 or the like based on a vertical synchronizing signal, a horizontal synchronizing signal, and a master clock. In addition, these signals are input to the vertical driving circuit 4, the column signal processing circuit 5, the horizontal driving circuit 6, or the like.

For example, the vertical driving circuit 4 includes shift registers and selects a pixel driving wiring. Further, the vertical driving circuit 4 supplies a pulse for driving the pixel to the selected pixel driving wiring and drives the pixel by a row unit. That is, the vertical driving circuit 4 selectively scans each pixel 2 of the pixel region 3 by a row unit in a sequentially vertical direction. In addition, the vertical driving circuit 4 supplies a pixel signal based on a signal charge to the column signal processing circuit 5 via a vertical signal line 9, and the signal charge is generated according to the amount of light received in, for example, the photodiode constituting a photoelectric conversion portion of each pixel 2.

For example, the column signal processing circuit 5 is disposed at every column of the pixels 2, and performs signal processing such as noise removal of the signal output from the pixels 2 for one row at every pixel column. That is, the column signal processing circuit 5 performs signal processing such as CDS, signal amplification, or AD conversion for removing specific fixed pattern noise of the pixel 2. A horizontal selection switch (not illustrated) is connected and installed between horizontal signal lines 10 in the output end of the column signal processing circuit 5.

For example, the horizontal driving circuit 6 includes shift registers, sequentially selects each column signal processing circuit 5 by sequentially outputting a horizontal scan pulse, and outputs the pixel signal from each column signal processing circuit 5 to the horizontal signal line 10.

The output circuit 7 performs signal processing with respect to the signal which is sequentially supplied through the horizontal signal line 10 from each column signal processing circuit 5 and outputs the processed signal. For example, in the signal processing, only buffering may be performed, or a black level adjustment, a column deviation correction, and various digital signal processing, or the like may be performed. An input-output terminal 12 performs a signal exchange with the external portion.

Figure 2A:
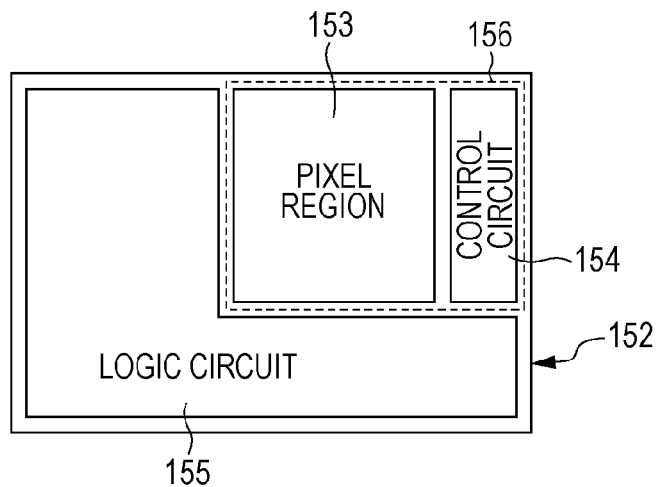
FIG. 2A is a diagram illustrating a configuration of a solid-state imaging device in the related art.

Next, the configuration of the MOS type of the solid-state imaging device according to the present embodiment will be described. FIG. 2A is a diagram illustrating the configuration of the solid-state imaging device in the related art, and FIGS. 2B and 2C are diagrams illustrating the configuration of the solid-state imaging device 1 according to the present embodiment.

As illustrated in FIG. 2A, in the solid-state imaging device 151 of the related art, a pixel region 153, a control circuit 154, and a logic circuit 155 for performing a signal processing are constituted so as to be mounted on a single semiconductor chip 152. In general, an image sensor 156 includes the pixel region 153 and the control circuit 154.

Figure 2B:
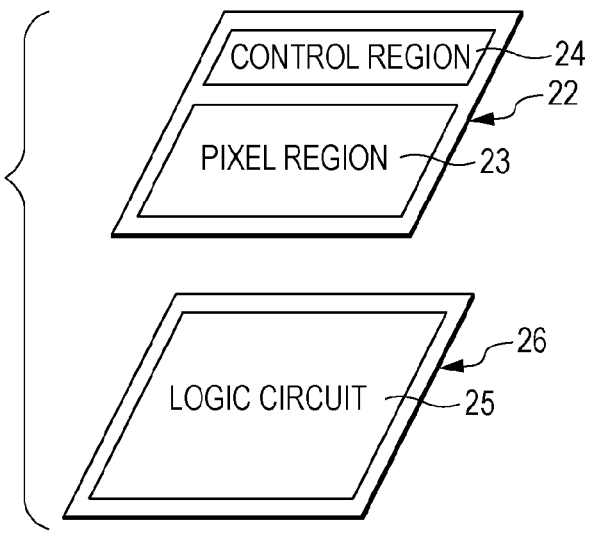
FIGS. 2B and 2C are diagrams illustrating a configuration of a solid-state imaging device according to an embodiment of the present disclosure.

In contrast, as illustrated in FIG. 2B, in the solid-state imaging device 1 of the present embodiment, a pixel region 23 and a control circuit 24 are mounted on a first semiconductor chip portion 22, and a logic circuit 25 including a signal processing circuit for performing a signal processing is mounted on a second semiconductor chip portion 26. The first semiconductor chip portion 22 and the second semiconductor chip portion 26 are electrically connected to each other and constitute the MOS type of the solid-state imaging device 1 as a single semiconductor chip.

Figure 2C:
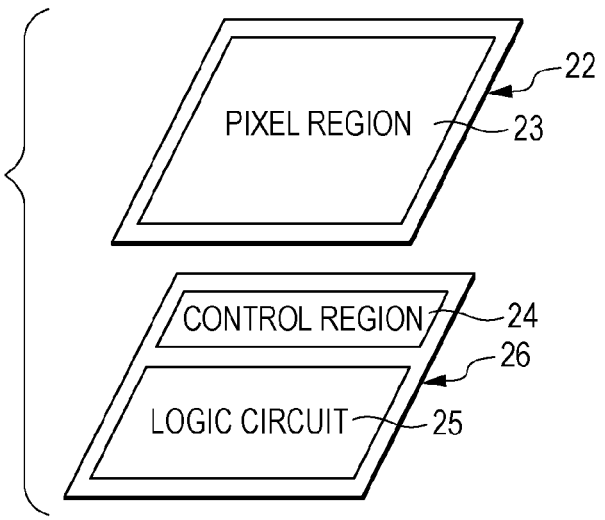

As illustrated in FIG. 2C, in the solid-state imaging device 1 of other example of the present embodiment, the pixel region 23 is mounted on the first semiconductor chip portion 22, and the control circuit 24 and the logic circuit 25 including the signal processing circuit are mounted on the second semiconductor chip portion 26. The first semiconductor chip portion 22 and the second semiconductor chip portion 26 are electrically connected to each other and constitute the MOS type of the solid-state imaging device 1 as a single semiconductor chip.

The solid-state imaging device 1 illustrated in FIGS. 2B and 2C includes the configuration on which different kinds of semiconductor chips are laminated, as described below, and includes a manufacturing method thereof and the configuration which is obtained based on the manufacturing method as the characteristics.

In the description below, configuration of a main portion of the solid-state imaging device 1 of the present embodiment and the manufacturing method thereof will be described.

1-2 Cross-Sectional Configuration of Main Portion

Figure 3:
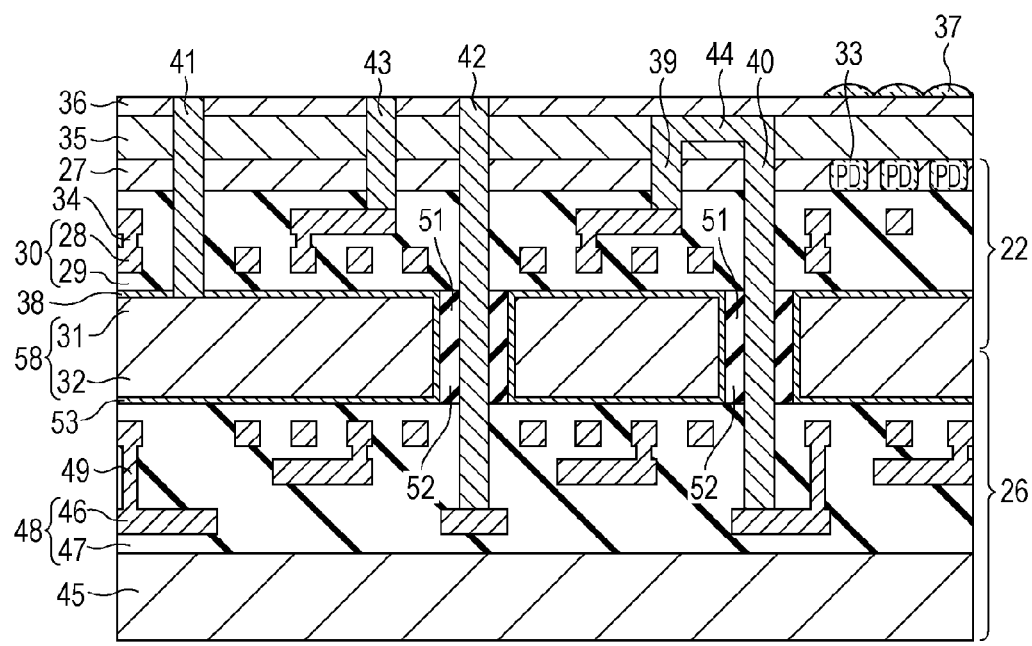
FIG. 3 is a diagram illustrating the cross-sectional configuration of the main portion of the solid-state imaging device according to the first embodiment of the present disclosure.

FIG. 3 is a configuration diagram illustrating a cross-section of the main portion of the solid-state imaging device 1 of the present embodiment. As illustrated in FIG. 2B, FIG. 3 illustrates an example in which the first semiconductor chip portion (hereinafter, referred to as "imaging element 22") on which the pixel region and the control region are mounted and the second semiconductor chip portion (hereinafter, referred to as "logic element 26") on which the logic circuit including the signal processing circuit is mounted are laminated.

In addition, in the description below, a wafer-like element on which the pixel region is formed, and the first semiconductor chip portion in which the wafer-like element is diced to a chip-shape and formed are not distinguished from each other, and all are referred to as "an imaging element". Similarly, a wafer-like element on which the logic circuit such as the signal processing circuit or memory is formed, and the second semiconductor chip portion in which the wafer-like element is diced to a chip-shape are not distinguished from each other, and all are referred to as "a logic element".

As illustrated in FIG. 3, the imaging element 22 and the logic element 26 are laminated and constitute the solid-state imaging device 1 of the present embodiment. In FIG. 3, in the imaging element 22, the cross-section in the pixel region and the control circuit formed on the periphery thereof is illustrated.

The imaging element 22 includes a first semiconductor substrate 27 having a photoelectric conversion portion 33, a first wiring layer 30 which is formed on the surface of the first semiconductor substrate 27, a first metal layer 31 which is formed on the surface of the side opposite to the first semiconductor substrate 27 of the first wiring layer 30, and a first insulating portion 51.

The photoelectric conversion portion 33 includes photodiodes (PD), and generates a signal charge according to the quantity of a sensed light. In addition, a plurality of pixel transistors (not illustrated) is formed on the surface side of the first semiconductor substrate 27.

The first wiring layer 30 includes wirings 28 in a plurality of layers (two layers in FIG. 3) which are formed on the surface of the first semiconductor substrate 27 via an interlayer insulating film 29. In the first wiring layer 30, a contact portion 34 is connected between predetermined wirings or between the wiring 28 and a pixel transistor (not illustrated). In the imaging element 22, the pixel region 23 and the control circuit 24 illustrated in FIG. 2B include the photoelectric conversion portion 33, the pixel transistor, and the first wiring layer 30.

The first metal layer 31 and the first insulating portion 51 are formed on the surface of the side opposite to the side facing the first semiconductor substrate 27 of the first wiring layer 30, and formed on the same layer. The insulating portion 51 is formed at only a region into which penetrating electrode layers 42 and 40 described hereinafter are penetrated, and is formed so as to have greater diameter than those of the penetrating electrodes 42 and 40. The first metal layer 31 is formed on the upper portion of the first wiring layer 30 on which the first insulating portion 51 is not formed, and is formed so as to be flush with the surface of the first insulating portion 51. In addition, a barrier metal layer 38 is formed between the first metal layer 31 and the first wiring layer 30 and between the first metal layer 31 and the first insulating portion 51.

The logic element 26 includes a second semiconductor substrate 45 in which desired transistors (not illustrated) are formed, a second wiring layer 48 which is formed on the surface of the second semiconductor substrate 45, a second metal layer 32 which is formed on the upper portion of the second wiring layer 48, and a second insulating portion 52.

The second wiring layer 48 includes wirings 46 in a plurality of layers (three layers in FIG. 3) which are formed on the surface of the second semiconductor substrate 45 via an interlayer insulating film 47. In the second wiring layer 48, a contact portion 49 is connected between predetermined wirings or between the wiring 46 and a transistor (not illustrated). In the logic element 26, as illustrated in FIG. 2B, the logic circuit 25 including the signal processing circuit, which process the pixel signal generated by the imaging element 22, includes transistors and the second wiring layer 48 which are formed on the second semiconductor substrate 45.

The second metal layer 32 and the second insulating portion 52 are formed on the upper portion of the second wiring layer 48, and formed on the same layer. Similar to the first insulating portion 51, the second insulating portion 52 is formed at only a region into which penetrating electrode layers 40 and 42 described hereinafter are penetrated, and is formed so as to have greater diameter than those of the penetrating electrodes 42 and 40. The second metal layer 32 is formed on the upper portion of the second wiring layer 48 on which the second insulating portion 52 is not formed, and is formed so as to be flush with the surface of the second insulating portion 52. In addition, a barrier metal layer 53 is formed between the second metal layer 32 and the second wiring layer 48 and between the second metal layer 32 and the second insulating portion 52.

In the solid-state imaging device 1 of the present embodiment, the second metal layer 32 and the surface of the second insulating portion 52 and the first metal layer 31 and the surface of the first insulating portion 51 described above become a bonding surface when bonding the imaging element 22 and the logic element 26. In addition, the bonded first metal layer 31 and second metal layer 32 constitute a shield layer 58 which electrically shields between the imaging element 22 and the logic element 26.

Preferably, the first metal layer 31 and the second metal layer 32 constituting the shield layer 58 are formed across the entire surface particularly in the pixel region, and are formed on the entire surface in which the first insulating portion 51 and the second insulating portion 52 are not formed. In order to improve a shield effect of the shield layer 58, it is preferable that the first insulating portion 51 and the second insulating portion 52 are formed in a necessary minimum area in the peripheral portion of the pixel region. Moreover, in order to obtain the optical shield effect, it is preferable that the thickness of the shield layer 58 including the first metal layer 31 and the second metal layer 32 is formed at 200 nm or more in the case of Cu.

Then, it is necessary that the shield layer 58 have an electric shield (noise countermeasure) function and an optical shield (shield countermeasure) function. In the case where Cu is used in the shield layer 58, the electric shield effect can be obtained by about the thickness of 200 nm of the wiring layer in view of the electricity. However, there is test data in which the optical shield (light shielding) necessitates the film thickness of 225 nm or more. Thereby, Cu having 200 nm or more in the thickness necessitates for obtaining the optical shield. Therefore, since the film thickness is not enough to use also the wiring constituted by Cu as the shield film, as the present embodiment, the shield layer 58 having 200 nm or more in the thickness is formed as the separated structure.

In the solid-state imaging device 1 of the present embodiment, the side on which the imaging element 22 is laminated becomes a light incident surface, and the rear surface side of the first semiconductor substrate 27 at which the photoelectric conversion portion 33 is formed becomes a light sensing surface. In addition, a color filter layer 36 is formed via a protective film 35 on the rear surface of the first semiconductor substrate 27 which is the light sensing surface, and an on-chip microlens 37 is formed for each pixel on the upper portion of the color filter layer 36 on which the pixel region is formed.

In addition, in the solid-state imaging device 1 of the present embodiment, the penetrating electrode layers 40 and 42 are formed from the light sensing surface side of the imaging element 22 to the wiring 46 of the second wiring layer 48 of the logic element 26 while penetrating, the first semiconductor substrate 27, the first wiring layer 30, the first insulating portion 51, and the second insulating portion 52. Further, a penetrating electrode layer 41 is formed from the light sensing surface side of the imaging element 22 to the shield layer 58 while penetrating the first semiconductor substrate 27, and penetrating electrode layers 39 and 43 are formed from the light sensing surface side to the wiring 28 of the first wiring layer 30. These penetrating electrode layers 39 to 43 are all formed so as to penetrate the first semiconductor substrate 27, and insulating films (not illustrated) insulate between the first semiconductor substrate 27 and the penetrating electrode layers 39 to 43.

Among the penetrating electrode layers, one penetrating electrode layer 40 connected to the wiring 46 of the second wiring layer 48 and the other one penetrating electrode layer 39 connected to the wiring 28 of the first wiring layer 30 are electrically connected to each other by a connective electrode portion 44 formed on the protective film 35. Thereby, the wiring 28 of the first wiring layer 30 and the wiring 46 of the second wiring layer 48 are electrically connected to each other.

In addition, one penetrating electrode layer 41 connected to the shield layer 58, the other one penetrating electrode layer 43 connected to the wiring 28 of the first wiring layer 30, and the still another one penetrating electrode layer 42 connected to the wiring 46 of the second wiring layer 48 are exposed to the light incident surface of the solid-state imaging device 1. These penetrating electrode layers 41 to 43 are connected to an external terminal in the light incident surface of the solid-state imaging device 1.

In the present embodiment, potential for driving the imaging element 22 or the logic element 26 is supplied to the penetrating electrode layers 42 and 43, and a ground potential is supplied to the penetrating electrode layer 41 connected to the shield layer 58.

In the solid-state imaging device 1 of the present embodiment, the first metal layer 31 and the second metal layer 32 formed on the bonding surface function as the shield layer 58 between the imaging element 22 and the logic element 26. That is, due to the fact that the first metal layer 31 and the second metal layer 32 are formed between the imaging element 22 and the logic element 26, influence of electromagnetic waves or generation of crosstalk generated due to operation of mutual elements can be decreased. In addition, malfunction due to heat generated by operation of mutual elements can also be decreased. Moreover, due to the fact that the shield layer 58 is connected to the ground potential via the penetrating electrode layer 41, the shield function is improved.

In addition, due to the fact the first metal layer 31 and the second metal layer 32 are formed between the mutual elements in the pixel region, the incident light is not incident to the logic element 26 of the lower layer. Thereby, the incident light can be prevented from being reflected to the wiring 46 of the second wiring layer 48 and the reflected light from being incident from the logic element 26 side into the photoelectric conversion portion 33. Therefore, color-mixing can be decreased, and an imaging performance can be improved.

1-3 Manufacturing Method

Next, a manufacturing method of the solid-state imaging device 1 of the present embodiment will be described. FIGS. 4A to 12 are process diagrams illustrating the manufacturing method of the solid-state imaging device 1 of the present embodiment.

Figure 4A:
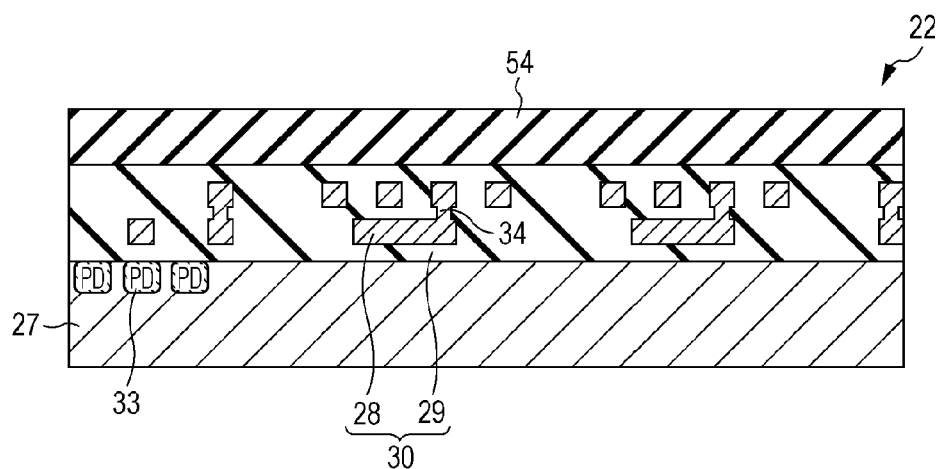
FIGS. 4A and 4B are process diagrams illustrating a manufacturing method of the solid-state imaging device according to the first embodiment of the present disclosure.

First, in the imaging element 22, as illustrated in FIG. 4A, the photoelectric conversion portion 33 including photodiodes is formed in the pixel region of the first semiconductor substrate 27 by performing ion implantation of desired impurities. For example, the first semiconductor substrate 27 has a thickness of 700 μm to 800 μm, and the region in which the photoelectric conversion portion 33 is formed is positioned at a region which is 100 μm or less from the surface of the first semiconductor substrate 27.

In addition, after the photoelectric conversion portion 33 or a plurality of pixel transistors (not illustrated) are formed on the surface of the first semiconductor substrate 27, the first wiring layer 30 is formed on the surface of the first semiconductor substrate 27. The first wiring layer 30 is formed by alternatively forming the interlayer insulating film 29 and the wiring 28. When an electric connection is performed between desired wirings or between the wiring 28 and the pixel transistor (not illustrated) in the first wiring layer 30, the connection can be performed due to the fact that the contact portion 34 is formed on the interlayer insulating film 29.

Figure 4B:
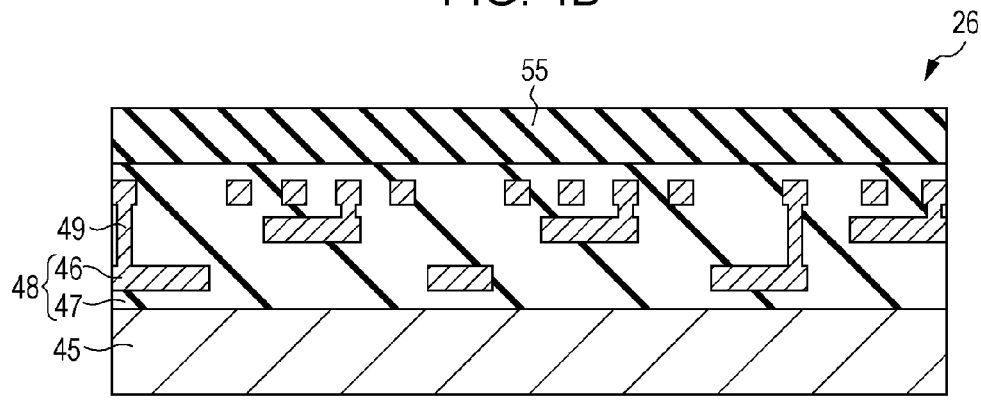

On the other hand, as illustrated in FIG. 4B, in the logic element 26, after transistors (not illustrated) are formed on the surface of the second semiconductor substrate 45 through a general LSI process, due to the fact that the second wiring layer 48 is formed on the surface of the second semiconductor substrate 45, a desired signal processing circuit or memory is formed. The second wiring 48 can be also formed similarly to the first wiring layer 30, and is formed by alternatively forming the interlayer insulating film 47 and the wiring 46. When an electric connection is performed between desired wirings or between wiring 46 and the pixel transistor (not illustrated) in the second wiring layer 48, the connection can be performed due to the fact that the contact portion 49 is formed on the interlayer insulating film 47.

The forming processes of the pixel region of the imaging element 22 or the signal processing circuit formed in the logic element 26 and the like are similar to the general forming process of the solid-state imaging device.

In addition, in the imaging element 22, after the interlayer insulating film 29 covering the uppermost wiring 28 is formed, an insulating material layer 54 is formed on the upper portion of the first wiring layer 30. Further in the logic element 26, similarly, after the interlayer insulating film 47 covering the uppermost wiring 46 is formed, an insulating material layer 55 is formed on the upper portion of the second wiring layer 48. The insulating material layers 54 and 55 can include insulating materials including a silicon oxide, a silicon nitride, or a silicon carbide.

Figure 5A:
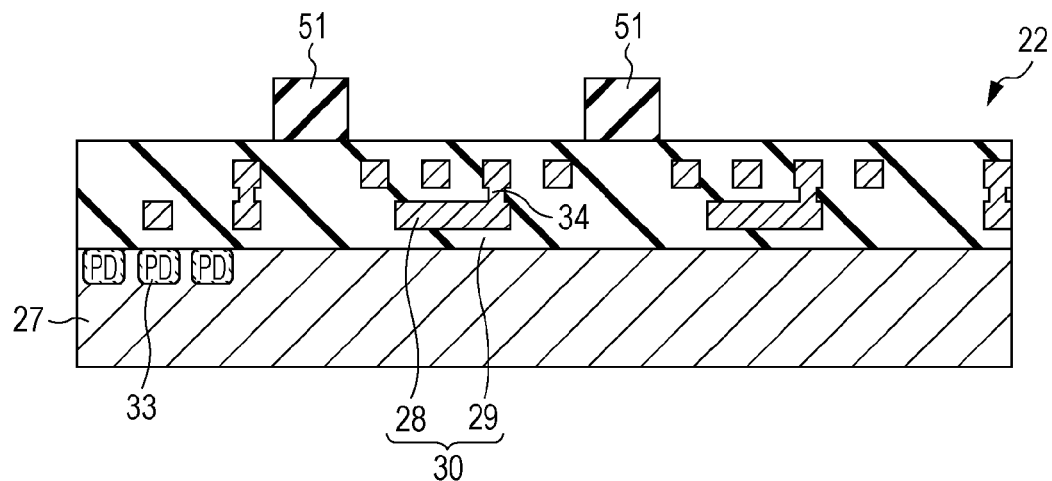
FIGS. 5A and 5B are process diagrams illustrating the manufacturing method of the solid-state imaging device according to the first embodiment of the present disclosure.
Figure 5B:
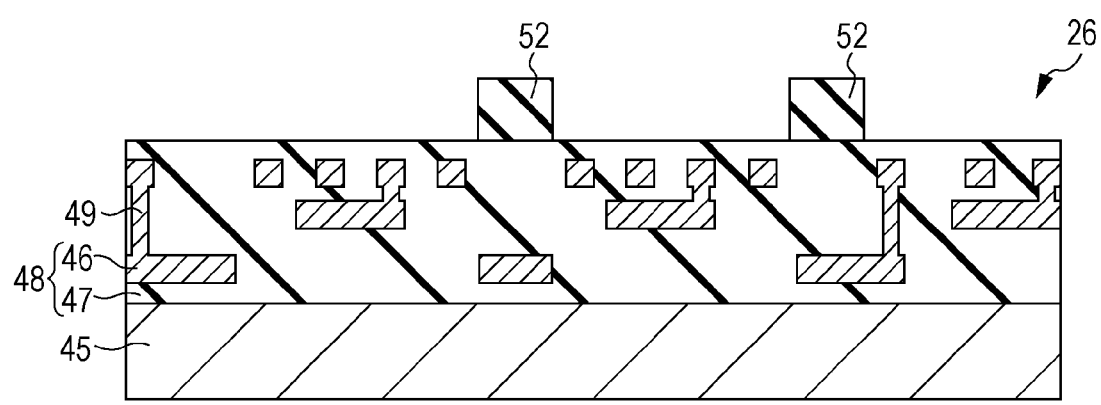

Next, as illustrated in FIGS. 5A and 5B, in the imaging element 22 and the logic element 26, the insulating material layers 54 and 55 are each subjected to an etching processing by using a general lithography method so that convex insulating material layers remain in desired regions. In the imaging element 22, the convex insulating material layer 54 constitutes the first insulating portion 51, and in the logic element 26, the convex insulating material layer 55 constitutes the second insulating portion 52. In subsequent processes, when the first insulating portion 51 and the second insulating portion 52 are bonded to each other while having each surface as the bonding surface, the first and second insulating portions 51 and 52 are formed so as to have a position relationship which is opposite to each other. In addition, since the first insulating portion 51 and the second insulating portion 52 become the region in which the penetrating electrode layers 40 and 42 illustrated in FIG. 3 are formed, considering the combination displacement, it is preferable that the first insulating portion 51 and the second insulating portion 52 are formed so as to have the diameters of about 1 μm larger than those of the penetrating electrode layers 40 and 42. For example, in the present embodiment, since the diameters of the penetrating electrode layers 40 and 42 are 2 μm, the convex first insulating portion 51 and the convex second insulating portion 52 are formed so as to have 3 μm in each diameter.

Figure 6A:
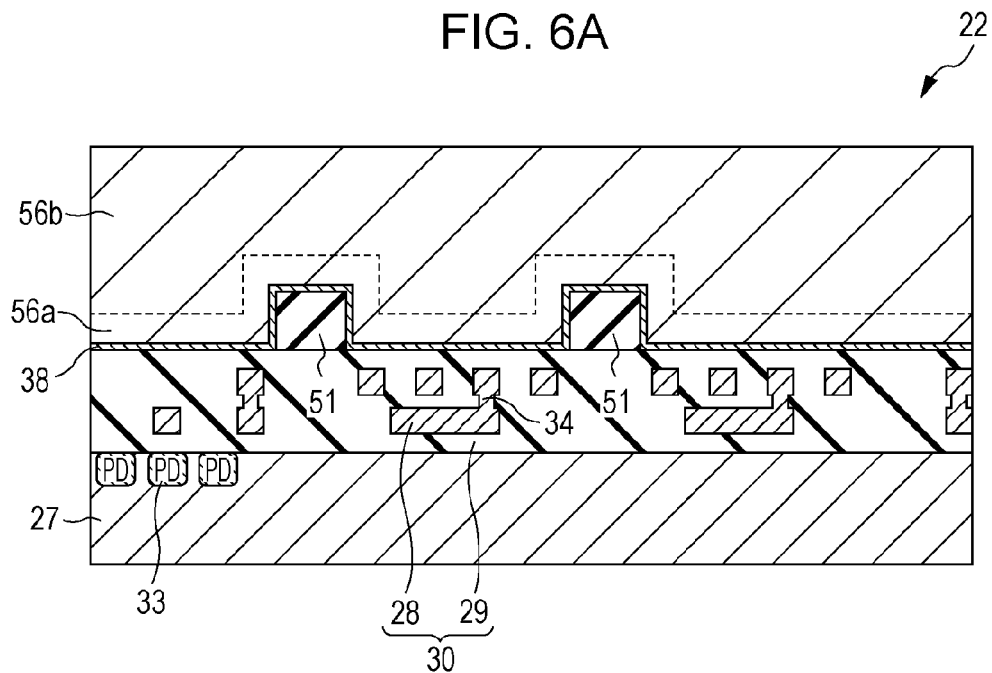
FIGS. 6A and 6B are process diagrams illustrating the manufacturing method of the solid-state imaging device according to the first embodiment of the present disclosure.
Figure 6B:
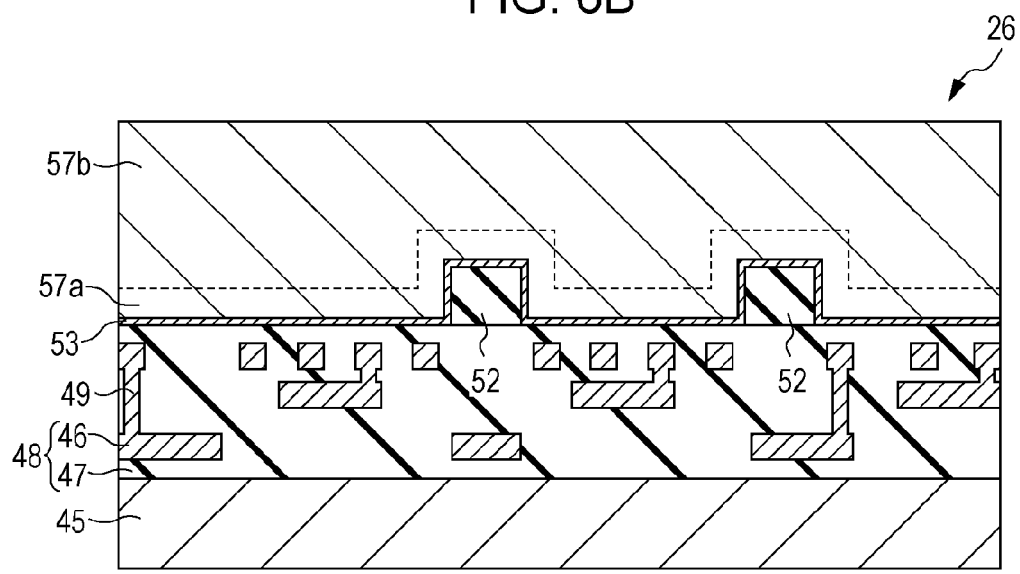

Next, as illustrated in FIGS. 6A and 6B, in the imaging element 22, a barrier metal layer 38 is formed on the entire surface including the first insulating portion 51 in the upper portion of the first wiring layer 30, thereafter, a metal seed layer 56a is formed thereon, and an electrolytic plating layer 56b for embedding the first insulating portion 51 is formed thereon. Similarly, in the logic element 26, a barrier metal layer 53 is formed on the entire surface including the second insulating portion 52 in the upper portion of the second wiring layer 48, thereafter, a metal seed layer 57a is formed thereon, and an electrolytic plating layer 57b for embedding the second insulating portion 52 is formed thereon.

The barrier metal layers 38 and 53 can be formed by a magnetron sputtering method in a high vacuum, and for example, may be formed of tantalum (Ta). An example of the film formation condition in the case where the barrier metal layers 38 and 53 are formed of tantalum by the magnetron sputtering method is like the following.

Magnetron Sputtering Method (Ta)
Power (DC Power): 5 kW
Process Gas: Argon gas of 100 sccm in the flow rate
Pressure: 0.4 Pa
Substrate Temperature: 150° C.
Film Thickness: 30 nm The barrier metal layers 38 and 53 may be also formed by using tantalum nitride (TaN). An example of the film formation condition in the case where the barrier metal layers 38 and 53 are formed of tantalum nitride by the magnetron sputtering method is like the following.

Magnetron Sputtering Method (TaN)
Power (DC Power): 5 kW
Process Gas: Argon gas of 30 sccm in the flow rate and Nitrogen gas of 80 sccm in the flow rate.
Pressure: 0.4 Pa
Substrate Temperature: 150° C.
Film Thickness: 30 nm After the barrier metal layers 38 and 53 are formed, the metal seed layers 56a and 57a are formed by serially using the magnetron sputtering method continuously in the high vacuum. The metal seed layers 56a and 57a are a layer which functions as an adhesive layer when forming the electrolytic plating layers 56a and 57b, and are constituted by copper (Cu). In the present embodiment, the metal seed layers 56a and 56b are formed with a thickness of 20 nm. Hereinafter, an example of the film formation condition in the case where the metal seed layers 56a and 56b are formed of copper is illustrated.

Magnetron Sputtering Method (Cu)
Power (DC Power): 5 kW
Process Gas: Argon gas of 100 sccm in the flow rate
Pressure: 0.4 Pa
Substrate Temperature: 20° C.
Film Thickness: 20 nm After the metal seed layers 56a and 57a are formed, the electrolytic plating layers 56b and 57b are formed to the thickness, in which the first insulating portion 51 and the second insulating portion 52 are coated, by using a Cu electrolytic plating method. Hereinafter, an example of the film formation condition in the case where the electrolytic plating layers 56b and 57b are formed of copper is illustrated. The following film formation condition is with respect to the first semiconductor substrate 27 and the second semiconductor substrate 45 each having diameters of 300 mmϕ.

Figure 7A:
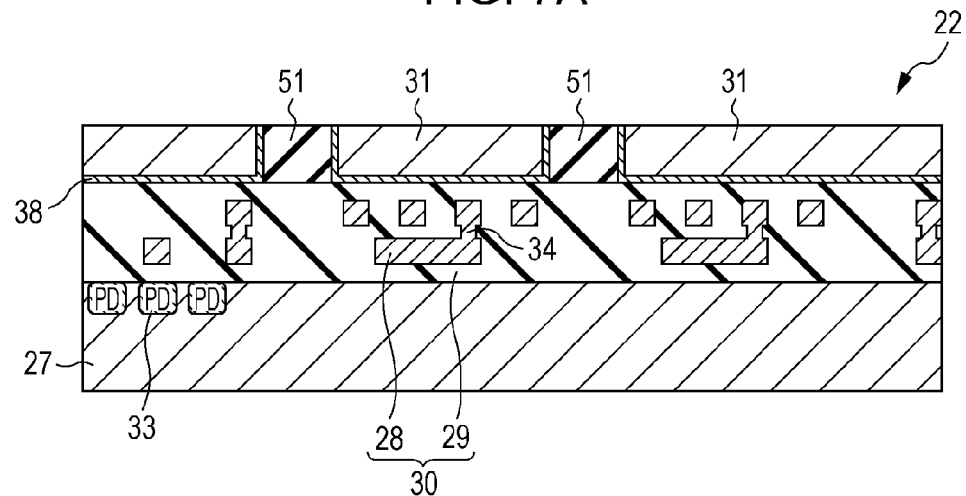
FIGS. 7A and 7B are process diagrams illustrating the manufacturing method of the solid-state imaging device according to the first embodiment of the present disclosure.
Figure 7B:
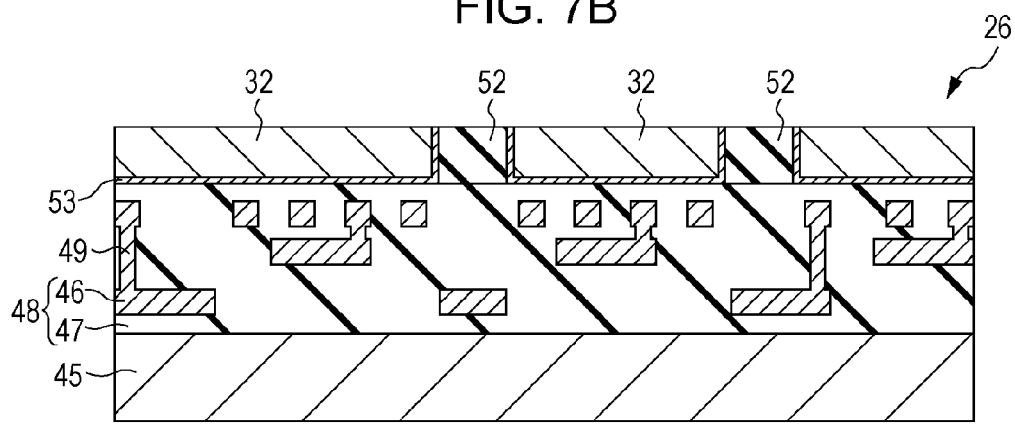

Electrolytic Plating Method (Cu)
Plating Solution: $CuSO_4$ (67 g/liter), $H_2SO_4$ (170 g/liter), HCl (70 ppm)
Solution Temperature: 20° C.
Current: 20 A
Film Thickness: 3 μm In addition, after the electrolytic plating layers 56b and 57b are formed at desired thicknesses, as illustrated in FIGS. 7A and 7B, in the imaging element 22 and the logic element 26 respectively, the layers of the upper portions of the first insulating portion 51 and the second insulating portion 52 are ground by using a CMP method (Chemical Mechanical Polishing). In the imaging element 22, the layer of the upper portion of the first insulating portion 51 is ground until the surface of the first insulating portion 51 is exposed. In addition, in the logic element 26, the layer of the upper portion of the second insulating portion 52 is ground until the surface of the second insulating portion 52 is exposed. Hereinafter an example of the CMP condition with respect to the electrolytic plating layers 56b and 57b and the metal seed layer 56a and 57a which are constituted by copper is illustrated.

CMP Condition
Grinding Pressure: 210 g/cm$^2$
Rotation Number: Surface Plate: 30 rpm, Polishing Head: 30 rpm
Polishing Pad: Foamed Polyurethane Resin (Made by RODALE Company, Product Name IC1400)
Slurry: $H_2O_2$ added (silica contained slurry)
Flow Rate: 200 cc/min
Temperature: 25° C. to 30° C.

In addition, hereinafter an example of the CMP condition with respect to the barrier metal layers 38 and 53 constituted by tantalum is illustrated.

CMP Condition
Polishing Pressure: 140 g/cm$^2$
Rotation Number: Surface Plate 30 rpm, Polishing Head 30 rpm
Polishing Pad: Foamed Polyurethane Resin (Made by RODALE Company, Product Name IC1400)
Slurry: $H_2O_2$ added (silica contained slurry)
Flow Rate: 200 cc/min
Temperature: 25° C. to 30° C.

Thereby, in the imaging element 22, the first metal layer 31 is formed at the same height as that of the surface of the first insulating portion 51 on the upper portion of the first wiring layer 30 excluding the first insulating portion 51. On the other hand, in the logic element 26, the second metal layer 32 is formed at the same height as that of the surface of the second insulating portion 52 on the upper portion of the second wiring layer 48 excluding the second insulating portion 52.

An oxide film or organic substance may be attached to the surfaces of the first metal layer 31 and the second metal layer 32 which are obtained as illustrated in FIGS. 7A and 7B. In the subsequent processes, when the imaging element 22 and the logic element 26 are bonded to each other while having the first metal layer 31 and the second metal layer 32 as the bonding surface, the oxide film or the organic substance impedes metal to metal bonding.

Figure 8A:
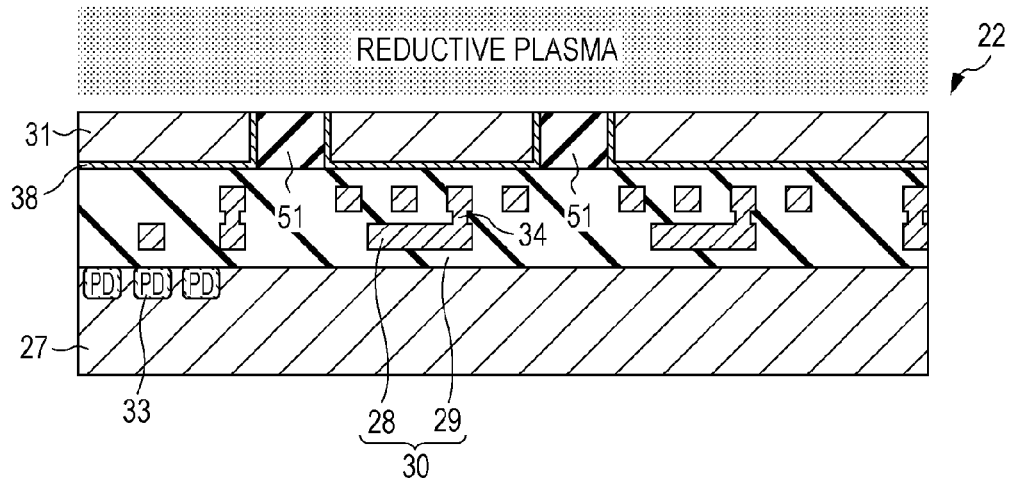
FIGS. 8A and 8B are process diagrams illustrating the manufacturing method of the solid-state imaging device according to the first embodiment of the present disclosure.
Figure 8B:
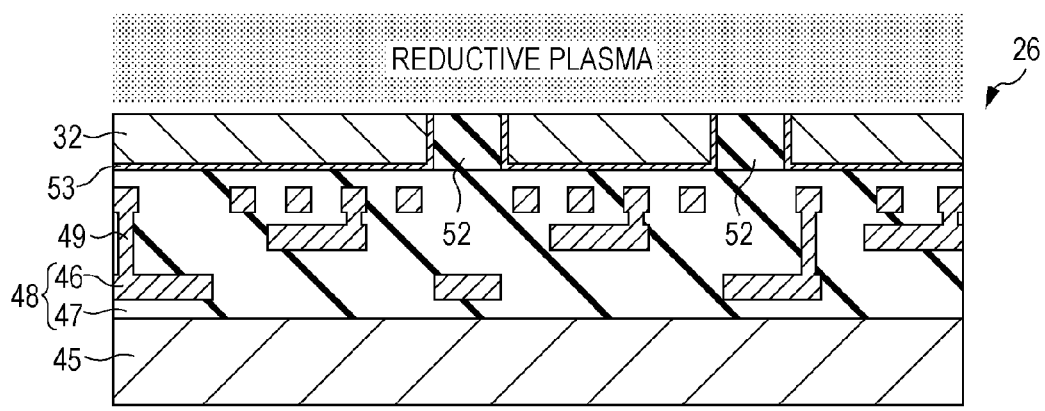

Thus, as illustrated in FIGS. 8A and 8B, the oxide film or organic substance attached on the surfaces of the first metal layer 31 of the imaging element 22 and the second metal layer 32 of the logic element 26 is removed by a reductive plasma processing. Hereinafter an example of a reductive condition of an oxide by using hydrogen plasma is illustrated.

Reductive Plasma (Hydrogen Plasma)
Gas: $H_2$/Ar=50 to 100/100 to 250 sccm
Microwave: 400 to 800 W, 2.45 GHz
Pressure: 0.3 to 2.0 Pa
Substrate Temperature: 150° C. to 300° C.
Time: 1 min In the above-described reductive condition, the oxide film, which is formed on the surfaces of the first metal layer 31 and the second metal layer 32 which are constituted by Cu, is reduced by the hydrogen plasma generated from ECR (Electron Cyclotron Resonance). However, other methods can be used as the method for exciting plasma. For example, the plasma may be generated by a parallel flat plate method, an inductive coupling method, or the like.

Moreover, when the organic substance formed on the surfaces of the first metal layer 31 and the second metal layer 32 is removed, it is preferable if an ammonia plasma processing is performed as below. Hereinafter an example of the condition of the ammonia plasma is illustrated.

Reductive Plasma (Ammonia Plasma)
Gas: $NH_3$/Ar=3 to 10/80 to 200 sccm
Platen Power: 200 to 500 W, 13.56 MHz
Coil Power: 300 to 800 W, 13.56 MHz Pressure: 0.3 to 1.0 Pa
Substrate Temperature: 150 to 300° C.
Time: 1 min Here, an ICP (Inductive Coupled Plasma) method is used. However, similarly to the hydrogen plasma, other plasma excitation methods may be used. Moreover, the surfaces of the first metal layer 31 and the second metal layer 32 are cleaned by the reductive plasma processing.

Figure 9:
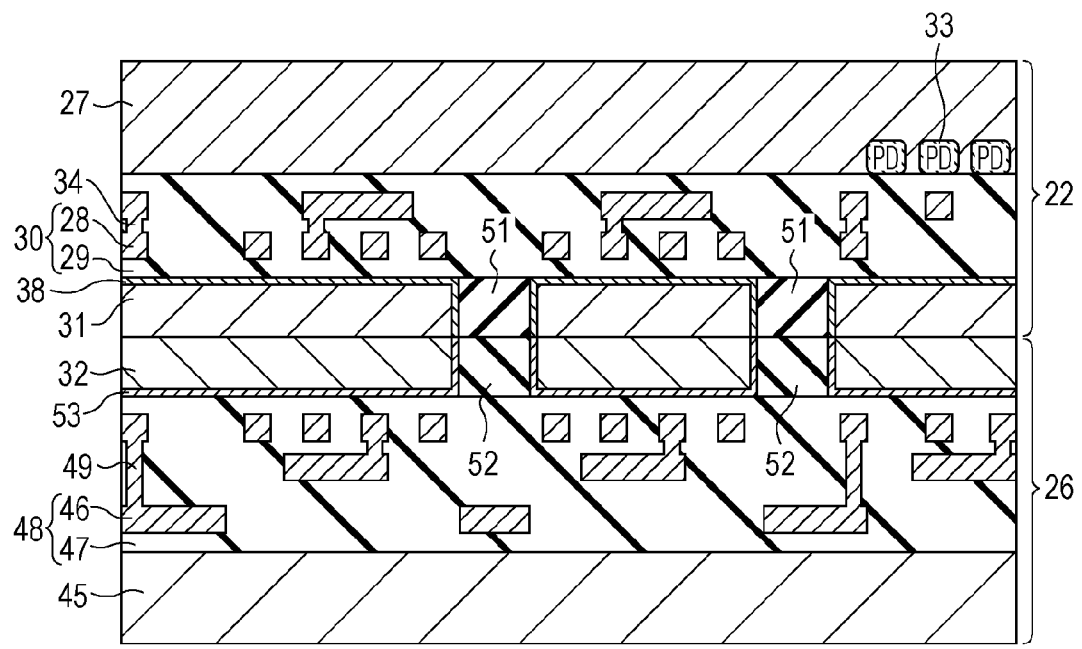
FIG. 9 is a process diagram illustrating the manufacturing method of the solid-state imaging device according to the first embodiment of the present disclosure.

Next, as illustrated in FIG. 9, the imaging element 22 and the logic element 26 are laminated so that the surface of the first metal layer 31 and the surface of the second metal layer 32 are the bonding surface. In this process, the imaging element 22 and the logic element 26 are aligned so that the first metal layer 31 and the second metal layer 32 face each other, and contact. Therefore, the imaging element 22 and the logic element 26 are bonded to each other by Cu to Cu bonding. In the previous process, since the surfaces of the first metal layer 31 and the second metal layer 32 are cleaned, the imaging element 22 and the logic element 26 can be easily bonded to each other due to the fact that the first metal layer 31 and the second metal layer 32 contact each other. At this time, the first insulating portion 51 and the second insulating portion 52 also face each other, and the surface of the first insulating portion 51 and the surface of the second insulating portion 52 are bonded to each other. In addition, it is preferable that the bonding process of FIG. 9 is performed in the state where the first metal layer 31 and the second metal layer 32 are cleaner, and it is also preferable that the bonding process is continuously performed in the vacuum apparatus of the reductive plasma processing of the previous process.

Moreover, the process of FIG. 9 is performed while observing an alignment mark (not illustrated) which is formed on the same layer as the first metal layer 31 and the second metal layer 32 of the imaging element 22 and the logic element 26 by a camera. In the imaging element 22, the alignment mark can be formed in an alignment mark region at the same time as the formation of the first insulating portion 51 due to the fact that the insulating material layer 54 of FIG. 4A is patterned to a desired shape. Similarly, also in the logic element 26, the alignment mark can be formed in an alignment mark region at the same time as the formation of the second insulating portion 52 due to the fact that the insulating material layer 55 illustrated in FIG. 4B is patterned to a desired shape. Moreover, in the process of FIG. 9, for example, the imaging element 22 and the logic element 26 are bonded to each other with high accuracy due to the fact that the position of the imaging element 22 and the position of the logic element 26 are adjusted while observing the alignment marks.

In addition, in order to perform the Cu to Cu bonding with higher strength through the first metal layer 31 and the second metal layer 32, an annealing processing may be performed. Hereinafter an example of the annealing condition in the case where the annealing processing is performed is illustrated.

Annealing Condition
Atmosphere: $N_2$
Pressure: Normal Pressure
Substrate Temperature: 100 to 400° C.

Figure 10:
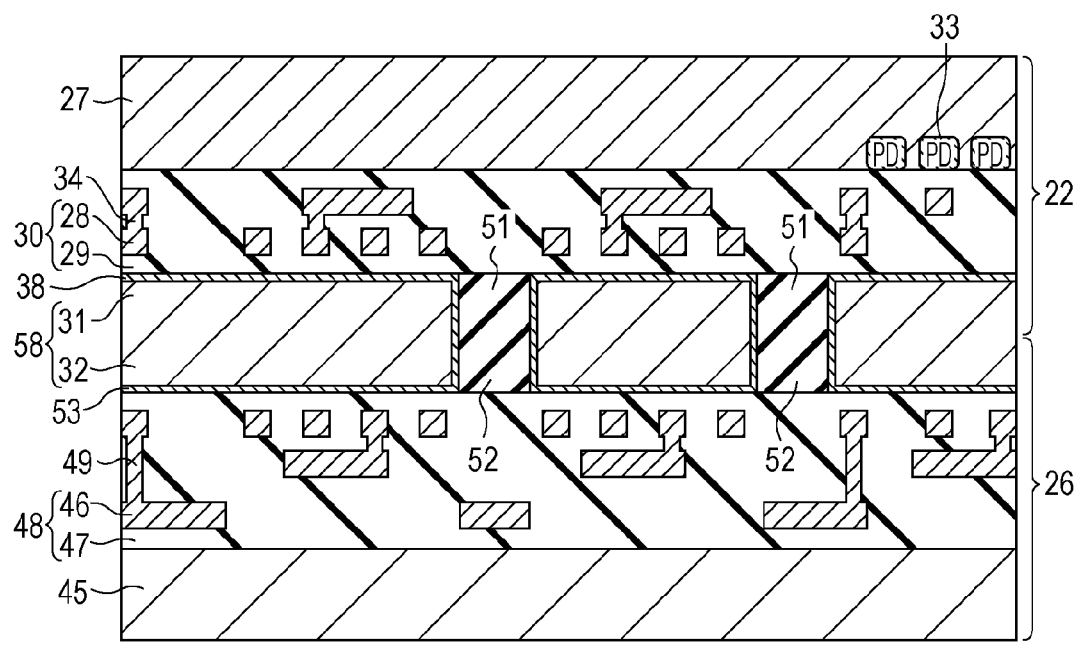
FIG. 10 is a process diagram illustrating the manufacturing method of the solid-state imaging device according to the first embodiment of the present disclosure.

In the above example, the annealing processing is performed in a nitrogen atmosphere. However, the annealing processing may be also performed in an inert atmosphere (Ar or the like), a reductive atmosphere ($H_2$, $H_2/N_2$ forming gas or the like), and the like in which Cu is not oxidized. Moreover, due to the fact the annealing processing is performed at approximately 100 to 400° C. of the substrate temperature, as illustrated in FIG. 10, crystals are integrated in the interface between the first metal layer 31 and the second metal layer 32, and the Cu to Cu bonding has the bonding strength capable of enduring the subsequent processes.

Figure 11:
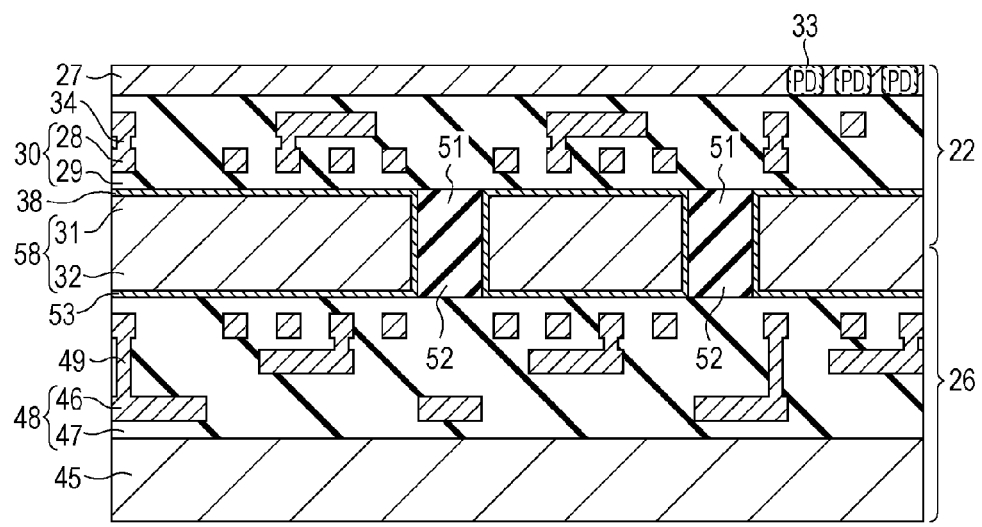
FIG. 11 is a process diagram illustrating the manufacturing method of the solid-state imaging device according to the first embodiment of the present disclosure.

Next, as illustrated in FIG. 11, the first semiconductor substrate 27 is ground from the rear surface side of the first semiconductor substrate 27 constituting the imaging element 22, and the first semiconductor substrate 27 is thinned to a thickness of several µ to 100 µm. In the thinning process, the first semiconductor substrate 27 is ground by a grinder. However, in the case where the substrate is thinned through the grinding of the grinder, a damaged layer (a crushed layer) remains on the substrate surface, and concerns such as decrease of the mechanical strength of the substrate, deterioration of the electric characteristic and the optical characteristic occur. Therefore, after the substrate is ground to some degree by the grinder, it is preferable that the crushed layer is removed by a dry polishing method incorporated in the grinder device or the CMP method using general slurry.

Moreover, due to the fact that the first semiconductor substrate 27 is thinned from the rear surface side, as illustrated in FIG. 11, the photoelectric conversion portion 33 is positioned in the vicinity of the rear surface of the first semiconductor substrate 27 in the imaging element 22. In addition, in the present embodiment, the rear surface side of the first semiconductor substrate 27 constituting the imaging element 22 becomes the light sensing surface. That is, the solid-state imaging device 1 of the present embodiment is a backside-illuminated solid-state imaging device.

Figure 12:
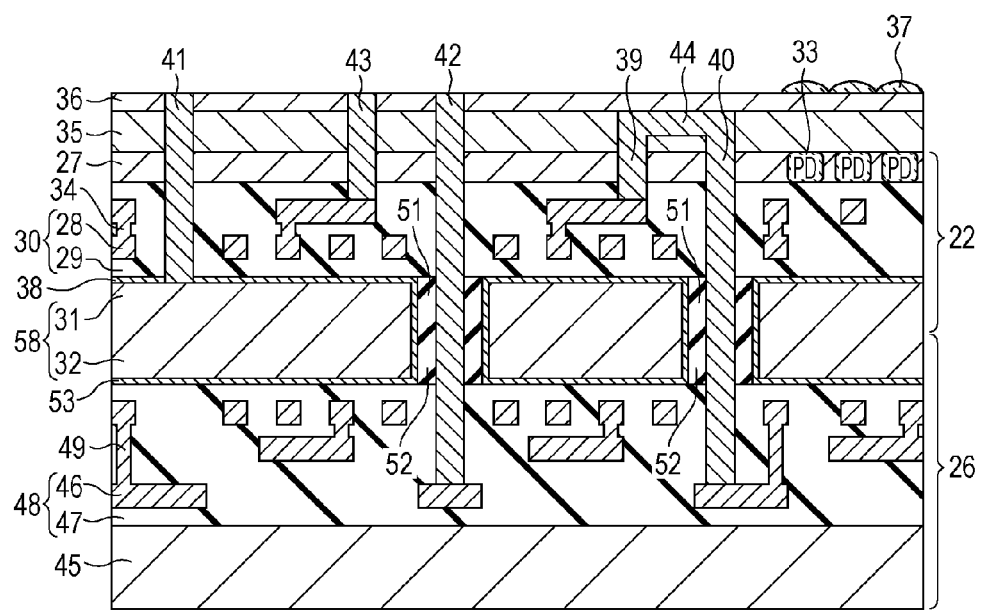
FIG. 12 is a process diagram illustrating the manufacturing method of the solid-state imaging device according to the first embodiment of the present disclosure.

Next, as illustrated in FIG. 12, the protective film 35 and the color filter layer 36 are formed on the rear surface side of the first semiconductor substrate 27, and the penetrating electrode layers 39 to 42 which penetrate the first semiconductor substrate 27 are formed. The penetrating electrode layers 39 and 40, which electrically connect the wiring 28 of the first wiring layer 30 and the wiring 46 of the second wiring layer 48 by the connective electrode portion 44, can be formed after the protective film 35 is formed. Moreover, the wiring 28 of the first wiring layer 30, the wiring 46 of the second wiring 48, or the penetrating electrode layers 41 to 43 which are connected to the first metal layer 31 can be formed from the upper surface of the color filter layer 36 after the color filter layer 36 is formed.

When the penetrating electrode layers 39 and 40 and the connective electrode portion 44 are formed, after the protective film 35 is formed, a groove is formed from the surface of the protective film 35 to a predetermined depth which does not reach the first semiconductor substrate 27 in the region which forms the connective electrode portion 44 of the protective film 35. Thereafter, a penetrating hole which penetrates the first semiconductor substrate 27 from the bottom portion of the groove and reaches the wiring 28 of the first wiring layer 30, and a penetrating hole which penetrates the first semiconductor substrate 27 from the bottom portion of the groove and reaches the wiring 46 of the second wiring layer 48 are formed respectively. In the formation of the penetrating holes, after the penetrating holes are formed to the depth which penetrates the first semiconductor substrate 27, an insulating film is formed so as to coat the inner surfaces in the penetrating holes to which the first semiconductor substrate 27 is exposed. Thereafter, the penetrating holes are further formed to predetermined depths. Thereafter, due to the fact that a conductive material such as Cu is embedded so as to embed the penetrating holes and the groove, the connective electrode portion 44 and the penetrating electrode layers 39 and 40 are formed. In addition, the wiring 28 of the first wiring layer 30 and the wiring 46 of the second wiring layer 48 are electrically connected to each other by the penetrating electrode 39 and 40 and the connective electrode portion 44.

Moreover, in this case, since the first semiconductor substrate 27, which is exposed to the inner surfaces of the penetrating holes, is coated by the insulating film (not illustrated), current does not flow from the penetrating electrode layers 39 and 40 to the first semiconductor substrate 27.

When the penetrating electrode layers 41 to 43, which are exposed to the surface of the color filter layer 36, are formed, after the color filter layer 36 is formed, the penetrating holes are formed from the surface of the color filter layer 36 to the depth which penetrates the first semiconductor substrate 27. In addition, due to the fact that the insulating film is formed on the inner peripheral surfaces of the penetrating holes, the first semiconductor substrate 27 which is exposed into the penetrating holes is coated. After the insulating film is formed, the penetrating holes are further formed to a predetermined depth. Thereby, the penetrating hole to which the wiring 28 of the first wiring layer 30 is exposed, the penetrating hole to which the shield layer 58 is exposed, and the penetrating hole to which the wiring 46 of the second wiring layer 48 is exposed are formed respectively. Moreover, due to the fact that the penetrating holes are embedded with the electrode material, the penetrating electrode layers 41 to 43 are each formed.

The penetrating electrode layer 43, which is connected to the wiring 28 of the first wiring layer 30 and exposed to the surface, is used as an electrode for extracting a signal from the imaging element 22. In addition, the penetrating electrode layer 42, which is connected to the wiring 46 of the second wiring layer 48 and exposed to the surface, is used as an electrode for extracting a signal from the logic element 26. Moreover, the penetrating electrode layer 41, which is connected to the shield layer 58 and exposed to the surface, is used as an electrode for connecting to the ground potential and an electrode for connecting to a radiation mechanism of the outside. Therefore, heat generated from the imaging element 22 and the logic element 26 can be decreased.

In addition, after the desired penetrating electrode layers 39 to 42 are formed, an on-chip microlens corresponding to each pixel is formed on the upper portion of the color filter layer 36. Thereby, the solid-state imaging device 1 of the present embodiment described in FIG. 3 is completed. In addition, actually, due to the fact that the wafer-like solid-state imaging device in which the imaging element 22 and the logic element 26 are laminated and formed is diced for each chip, a plurality of solid-state imaging devices are formed.

According to the solid-state imaging device 1 of the present embodiment, the first metal layer 31 is formed in the imaging element 22, the second metal layer 32 is formed on the logic element 26, and the imaging element 22 and the logic element 26 are bonded to each other so that the surfaces of the first metal layer 31 and the second metal layer 32 are bonding surfaces. In addition, the imaging element 22 and the logic element 26 are easily bonded to each other by the Cu to Cu bonding. Thereby, the imaging element 22 and the logic element 26 can be easily laminated.

In the solid-state imaging device 1 of the present embodiment, the first metal layer 31 is constituted by Cu, and the barrier metal layers 38 and 53 of the second metal layer 32 are constituted by Ta or TaN. However, the present embodiment is not limited to this. For example, among elements which are laminated, the barrier metal layer of at least one element may include ferromagnetic (for example, steel, cobalt, nickel, gadolinium), and therefore, influence due to magnetic field generated from mutual elements can be blocked.

When a cobalt film is laminated on a portion of the barrier metal layers 38 and 53, for example, the cobalt film may be formed to have a thickness of 50 nm by using a general magnetron sputtering method. In addition, when the barrier metal layers 38 and 53 are laminated with Ta (15 nm)/Co (50 nm)/Ta (15 nm), methods other than the magnetron sputtering method, for example, non-electrolytic plating and the like may be used. In this way, the configurations of the barrier metal layers 38 and 53 may be variously modified.

In addition, in the solid-state imaging device 1 of the present embodiment, the first metal layer 31 and the second metal layer 32 constituting the shield layer 58 use copper. However, further, silver (Ag), gold (Au), or metal materials including copper, silver, and gold may be used.

2. Second Embodiment

MOS Type of Backside-Illuminated Solid-State Imaging Device

Next, a solid-state imaging device according to a second embodiment of the present disclosure will be described. The solid-state imaging device of the present embodiment is an example in which an electrolytic plating layer constituting the first metal layer and the second metal layer is formed so as to be divided in two stages. FIGS. 13A to 17 are cross-sectional diagrams illustrating a manufacturing method of the solid-state imaging device of the present embodiment. In FIG. 13A to 17, the parts corresponding to those of FIG. 3 are denoted by the same reference numbers and overlapping descriptions are omitted.

Figure 13A:
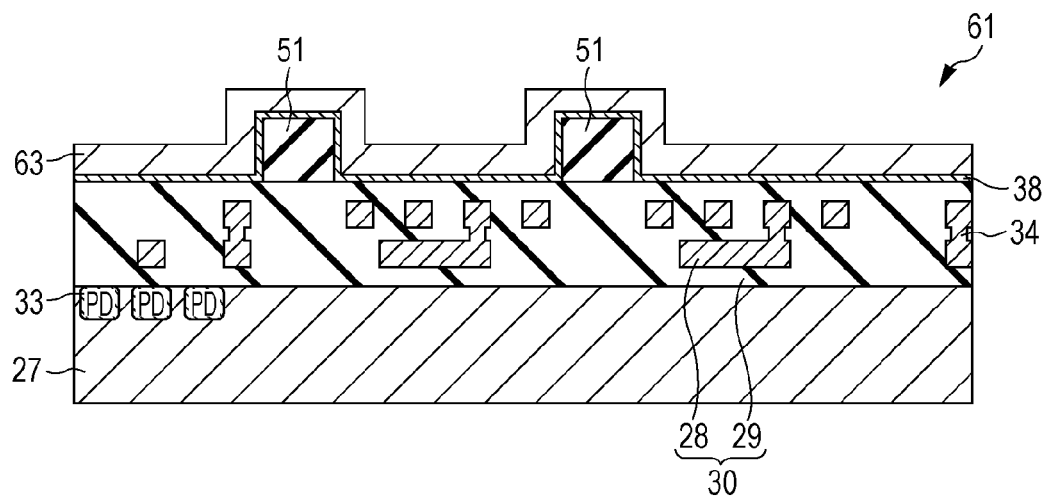
FIGS. 13A and 13B are process diagrams illustrating a manufacturing method of a solid-state imaging device according to a second embodiment of the present disclosure.
Figure 13B:
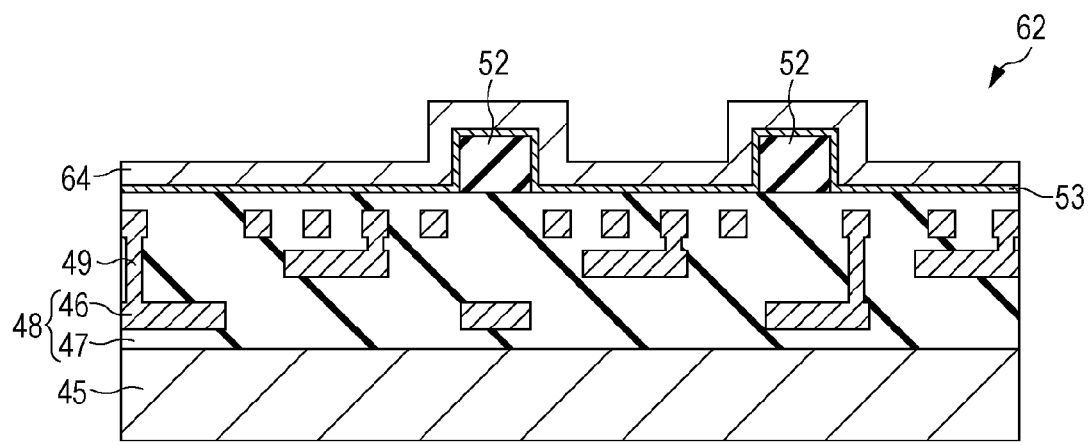

First, in an imaging element 61, similarly to FIGS. 4A to 6B, after the barrier metal layer 38 and the metal seed layer (not illustrated) are formed, as illustrated in FIG. 13A, an electrolytic plating layer 63 including Cu of a first stage is formed to have thickness of 0.5 μm. Similarly, in a logic element 62, after the barrier metal layer 38 and the metal seed layer (not illustrated) are formed similarly to the FIGS. 4A to 6B, as illustrated in FIG. 13B, an electrolytic plating layer 64 including Cu of a first stage is formed to have thickness of 0.5 μm. At this time, a film formation condition of the electrolytic plating layers 63 and 64 is similar to the film formation condition of FIGS. 6A and 6B.

Figure 14A:
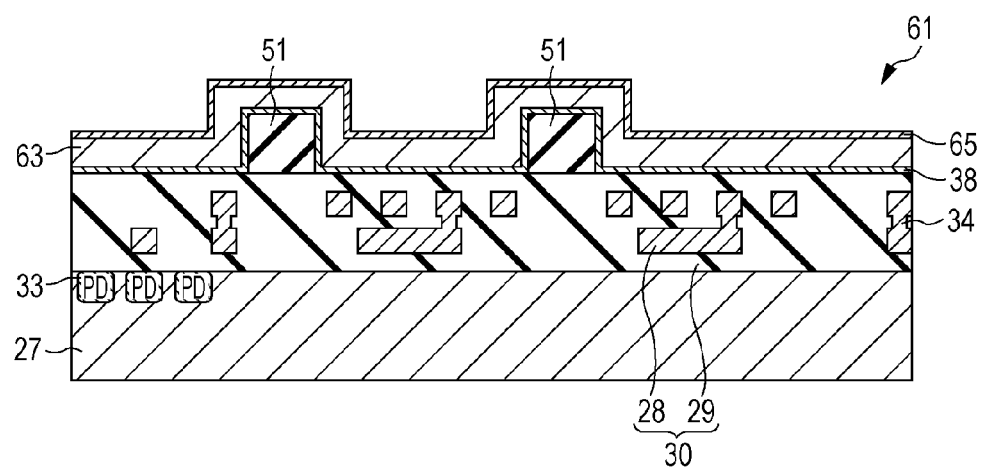
FIGS. 14A and 14B are process diagrams illustrating the manufacturing method of the solid-state imaging device according to the second embodiment of the present disclosure.
Figure 14B:
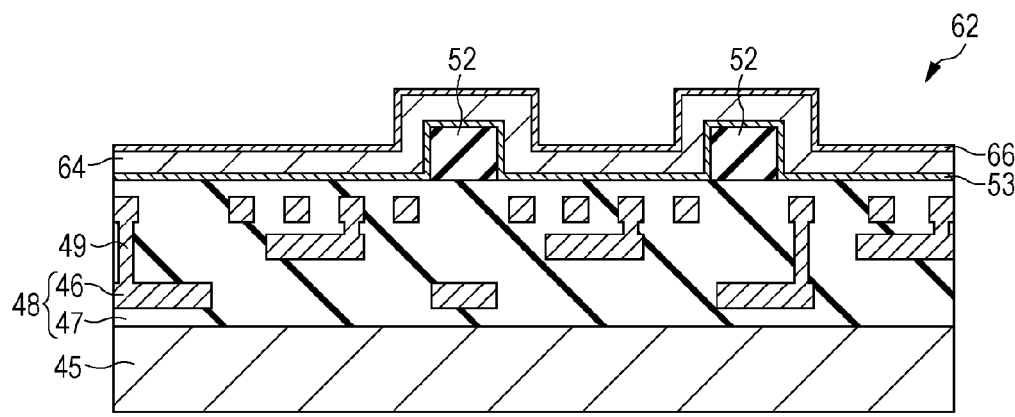

Next, as illustrated in FIGS. 14A and 14B, in the imaging element 61 and the logic element 62, non-electrolytic plating layers 65 and 66 including Co are formed to 0.1 μm in the thickness so as to coat the electrolytic plating layers 63 and 64. An example of a film formation condition of the non-electrolytic plating layers 65 and 66 including Co is illustrated hereinafter.

Non-Electrolytic Plating Method (Co)
Chemical Solution: CONBUS M (made by WORLD METAL Company)
Temperature: 70 to 80° C.

Figure 15A:
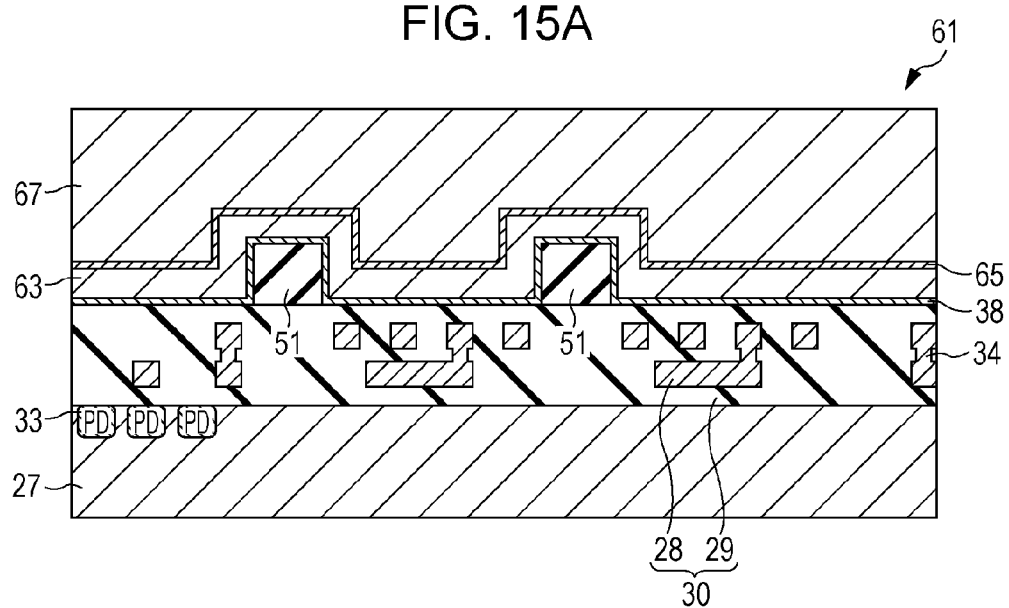
FIGS. 15A and 15B are process diagrams illustrating the manufacturing method of the solid-state imaging device according to the second embodiment of the present disclosure.
Figure 15B:
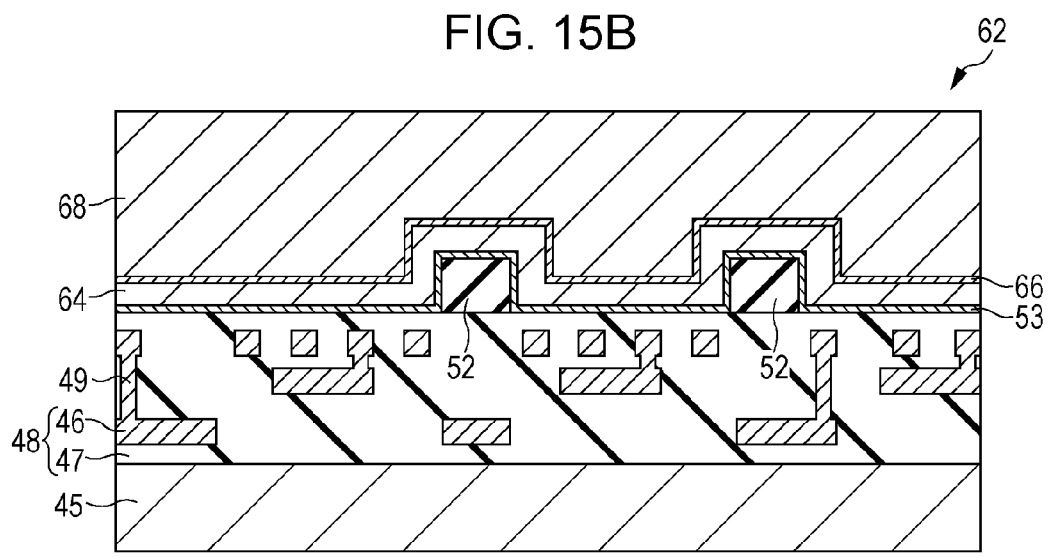

Next, as illustrated in FIGS. 15A and 15B, in the imaging element 61 and the logic element 62, electrolytic plating layers 67 and 68 including Cu of a second stage are formed to have thickness of 2.5 μm. Further in the electrolytic plating layers 67 and 68 of the second stage, the same condition as the film formation condition of FIGS. 6A and 6B can be applied.

Figure 16A:
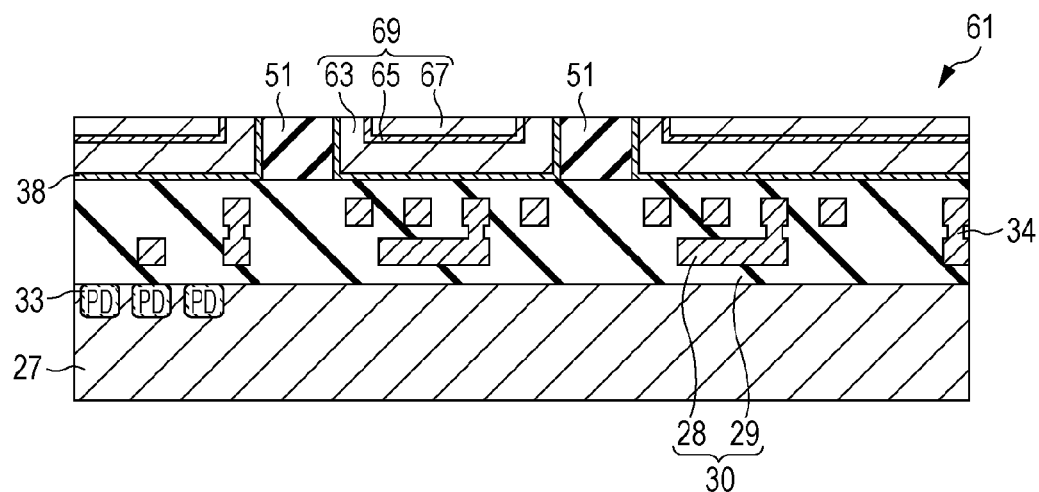
FIGS. 16A and 16B are process diagrams illustrating the manufacturing method of the solid-state imaging device according to the second embodiment of the present disclosure.
Figure 16B:
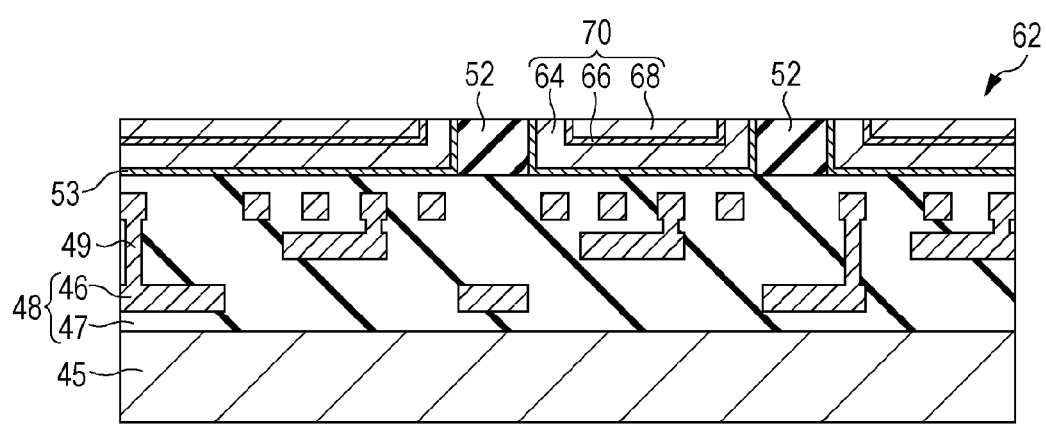

Next, as illustrated in FIGS. 16A and 16B, in the imaging element 61, the metal layer of the upper layer is ground until the surface of the first insulating portion 51 is exposed, and a first metal layer 69 including the non-electrolytic plating layer 65 and the electrolytic plating layers 63 and 67 is formed on the upper portion of the first wiring layer 30 excluding the region in which the first insulating portion 51 is formed. Similarly, also in the logic element 62, the metal layer of the upper layer is ground until the surface of the second insulating portion 52 is exposed, and a second metal layer 70 including the non-electrolytic plating layer 66 and the electrolytic plating layers 64 and 68 is formed on the upper portion of the second wiring layer 48 excluding the region in which the second insulating portion 52 is formed. The processes of FIGS. 16A and 16B may be performed in the condition similar to that of processes of FIGS. 7A and 7B.

Figure 17:
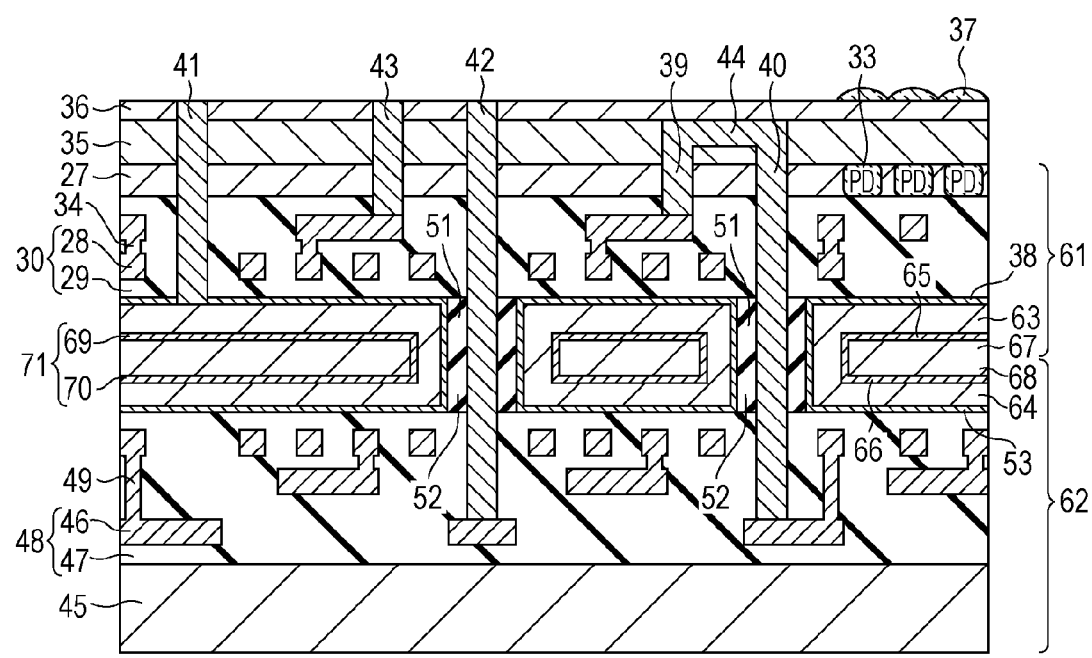
FIG. 17 is a diagram illustrating a cross-sectional configuration of the solid-state imaging device according to the second embodiment of the present disclosure.

In addition, also in the present embodiment, similarly to the first embodiment, after the surfaces of the first metal layer 69 and the second metal layer 70 are cleaned, as illustrated in FIG. 17, the imaging element 61 and the logic element 62 are laminated so that the first metal layer 69 and the second metal layer 70 are bonded to each other.

Thereafter, through processes similar to those of the first embodiment, the solid-state imaging device of the present embodiment described in FIG. 17 is completed. In the solid-state imaging device of the present embodiment, while the electrolytic plating layers including Cu in two stages are formed, the non-electrolytic plating layers 65 and 66 including Co are formed. Thereby, a shield layer 71 including the first metal layer 69 and the second metal layer 70 is constituted so as to include a Cu layer having a radiation function and a Co film for blocking a magnetic field.

In the present embodiment, the shield layer 71 formed between the imaging element 61 and the logic element 62 includes a configuration which laminates the material having the radiation function and the material for blocking the magnetic field. Thereby, heat generated by operation of mutual elements can be decreased, and influence of electromagnetic waves can be further decreased.

Further, effects similar to those of the first embodiment can be obtained.

3. Third Embodiment

MOS Type of Backside-Illuminated Solid-State Imaging Device

Figure 18A:
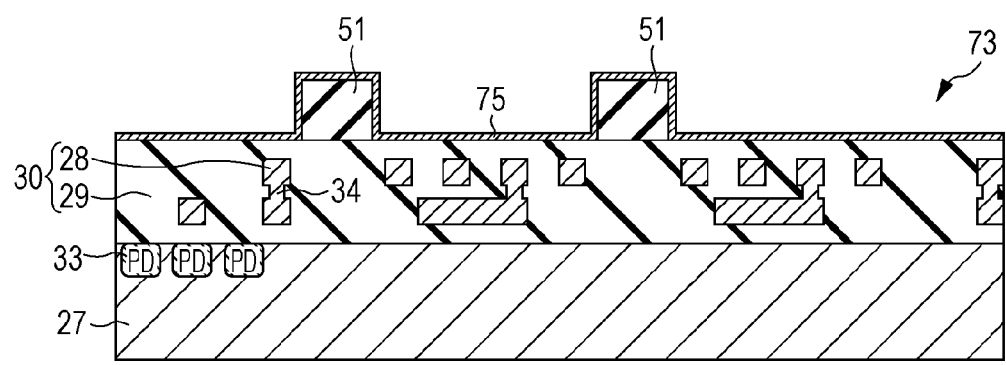
FIGS. 18A and 18B are process diagrams illustrating a manufacturing method of a solid-state imaging device according to a third embodiment of the present disclosure.
Figure 18B:
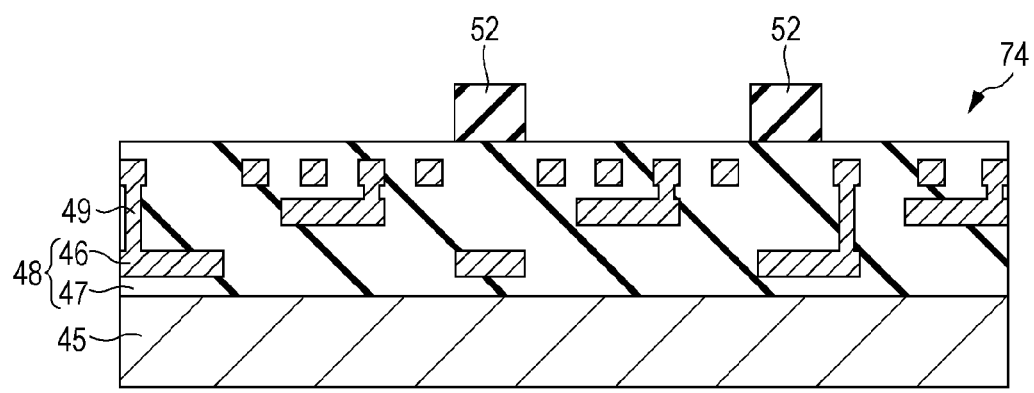
Figure 19:
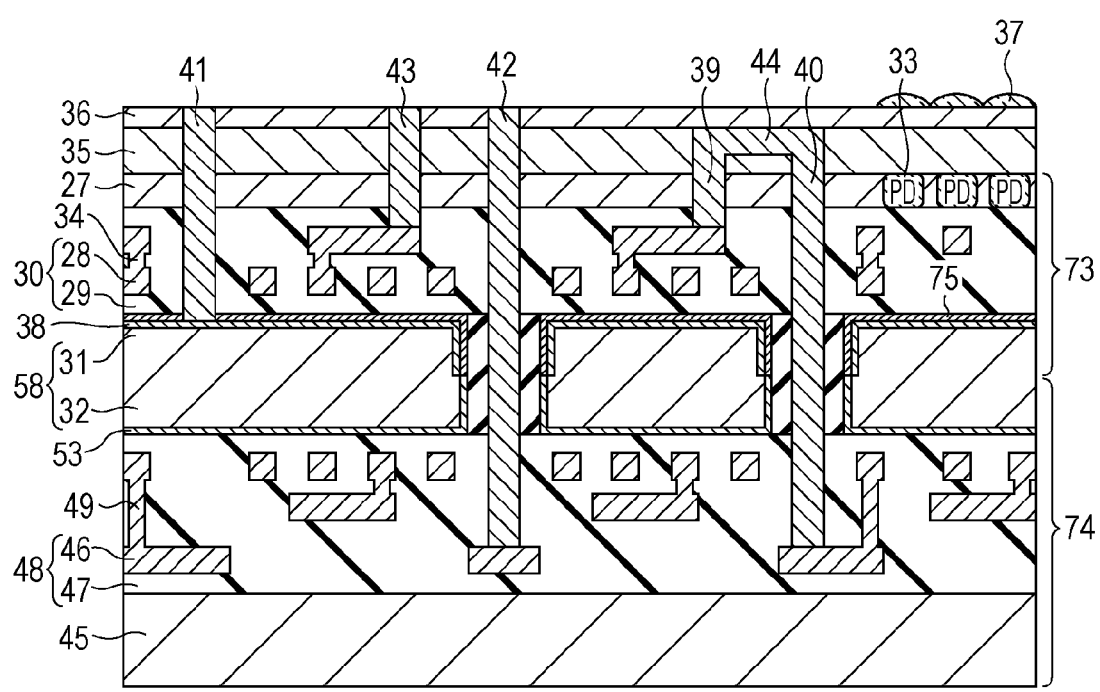
FIG. 19 is a diagram illustrating a cross-sectional configuration of the solid-state imaging device according to the third embodiment of the present disclosure.

Next, a solid-state imaging device according to a third embodiment of the present disclosure will be described. The solid-state imaging device of the present embodiment is an example which forms an antireflective configuration in the imaging element. FIGS. 18A to 19 are process diagrams illustrating a manufacturing method of the solid-state imaging device of the present embodiment. In FIGS. 18A to 19, the parts corresponding to those of FIG. 3 denoted by the same reference numbers and the overlapping descriptions are omitted.

First, in an imaging element 73, similarly to FIGS. 4A to 5B, after the first insulating portion 51 is formed, as illustrated in FIG. 18A, a light absorption layer 75 is formed on the entire surface of the upper portion of the first wiring layer 30 including the first insulating portion 51. In the imaging element 73, since the light absorption layer 75 is a layer which absorbs light incident from the rear surface side of the first semiconductor substrate 27, the light absorption layer 75 may be formed on at least the imaging element 73 side only. Thereby, in the present embodiment, as illustrated in FIG. 18B, the light absorption layer 75 is not formed in the logic element 74.

The light absorption layer 75 can be formed by a magnetron sputtering method in a high vacuum. In addition, for example, the light absorption layer 75 can be formed of carbon (C). Hereinafter an example of a film formation condition where the light absorption layer 75 is formed of carbon by the magnetron sputtering method is illustrated.

Magnetron Sputtering Method (C)
Power (DC Power): 5 kW
Process Gas: Argon gas having 100 sccm in the flow rate
Pressure: 0.4 Pa
Substrate Temperature: 150° C.
Film Thickness: 500 nm The film formation method of the light absorption layer 75 including carbon may use methods such as a coating method other than the above-described magnetron sputtering method.

Thereafter, through processes similar to the processes of FIGS. 6A to 12, the imaging element 73 and the logic element 74 are laminated. In addition, the protective film 35, the color filter layer 36, respective penetrating electrode layers 39 to 42, and the on-chip microlens 37 are formed, and therefore, the solid-state imaging device described in FIG. 19 is completed.

In the solid-state imaging device of the present embodiment, since the light absorption layer 75 is formed on the light incident side of the shield layer 58 including the first metal layer 31 and the second metal layer 32, light, which is incident from the imaging element 73 side and transmitted to the first semiconductor substrate 27 and the first wiring layer 30, is absorbed by the light absorption layer 75. Therefore, since the incident light is not reflected to the shield layer 58, the light reflected at the shield layer 58 is not incident to the photoelectric conversion portion 33 of another pixel, and color-mixing is decreased.

Further, effects similar to those of the first embodiment can be obtained.

4. Fourth Embodiment

MOS Type of Backside-Illuminated Solid-State Imaging Device

Figure 20:
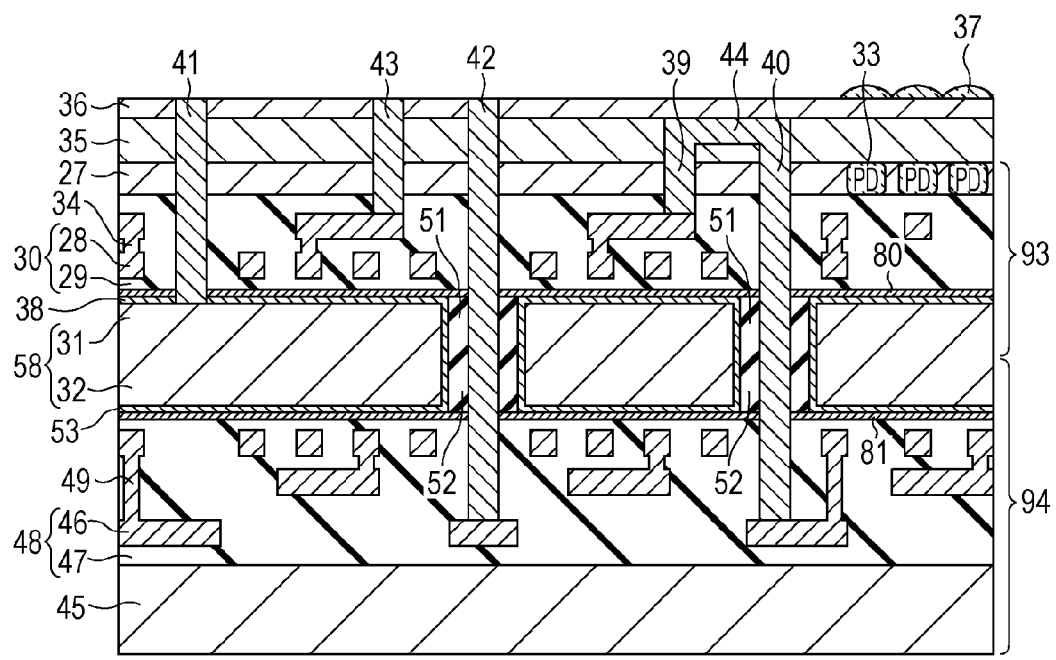
FIG. 20 is a diagram illustrating a cross-sectional configuration of a solid-state imaging device according to a fourth embodiment of the present disclosure.

Next, a solid-state imaging device according to a fourth embodiment of the present disclosure will be described. FIG. 20 is a diagram illustrating a cross-section of the solid-state imaging device of the present embodiment. The solid-state imaging device of the present embodiment is an example in which light absorption layers 80 and 81 are formed on the entire surface of the upper portion of the first wiring layer 30 and the second wiring layer 48 in the imaging element 93 and the logic element 94. In FIG. 20, the parts corresponding to those of FIG. 3 denoted by the same reference numbers and the overlapping descriptions are omitted.

As illustrated in FIG. 20, in the solid-state imaging device of the present embodiment, in an imaging element 93, a light absorption layer 80 having a light absorption characteristic is formed on the surface of the side opposite to the side which faces the first semiconductor substrate 27 of the first wiring layer 30. In addition, the first insulating portion 51 and the first metal layer 31 are formed on the light absorption layer 80. Moreover, similarly, also in a logic element 94, a light absorption layer 81 having the light absorption characteristic is formed on the entire surface of the side opposite to the side which faces the second semiconductor substrate 45 of the second wiring layer 48, and the second insulating portion 52 and the second metal layer 32 are formed on the light absorption layer 81.

These light absorption layers 80 and 81 are constituted by Si, O and N, and are formed by the CVD method. In FIG. 20, the light absorption layers 81 and 82 are illustrated as single layer configuration. However, the light absorption layers 81 and 82 may be a configuration which laminates materials having each absorption band with respect to each wavelength of R (red), G (green), and B (blue). In the imaging element 93 and the logic element 94, after the light absorption layers 80 and 81 are formed, the solid-state imaging device of the present embodiment can be formed by using the manufacturing methods similar to those of FIGS. 7A to 12.

In the present embodiment, light incident from the imaging element 93 side is transmitted to the first semiconductor substrate 27 and the first wiring layer 30, and is absorbed at the light absorption layer 80. Therefore, since the incident light is not reflected to the shield layer 58 and the light reflected at the shield layer 58 is not incident to the photoelectric conversion portion 33 of other pixel, color-mixing is decreased. In addition, since luminescence due to operation of the logic element 94 which is laminated at the lower layer of the imaging element 93 is not incident to the imaging element 93 side, influence of the luminescence due to operation of the logic element 94 can be decreased.

Further, effects similar to those of the first embodiment can be obtained.

5. Fifth Embodiment

MOS Type of Backside-Illuminated Solid-State Imaging Device

Figure 21A:
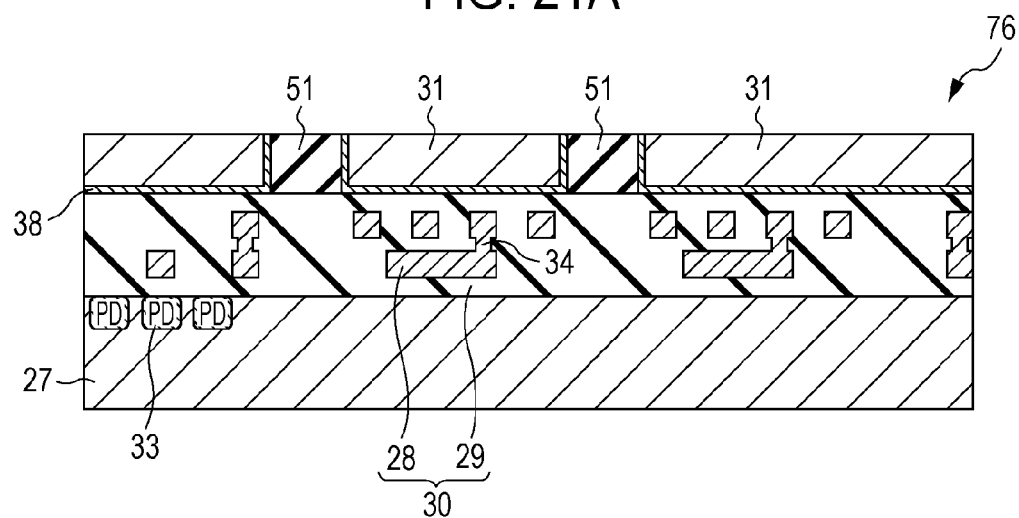
FIGS. 21A and 21B are process diagrams illustrating a manufacturing method of a solid-state imaging device according to a fifth embodiment of the present disclosure.

Next, a solid-state imaging device according to a fifth embodiment of the present disclosure will be described. FIGS. 21A to 22 are process diagrams illustrating a manufacturing method of the solid-state imaging device of the present embodiment. The solid-state imaging device of the present embodiment is an example in which a metal layer 78 having a low melting point is formed at the bonding surface between an imaging element 76 and a logic element 77. In FIGS. 21A to 22, the parts corresponding to those of FIG. 3 denoted by the same reference numbers and the overlapping descriptions are omitted.

Figure 21B:
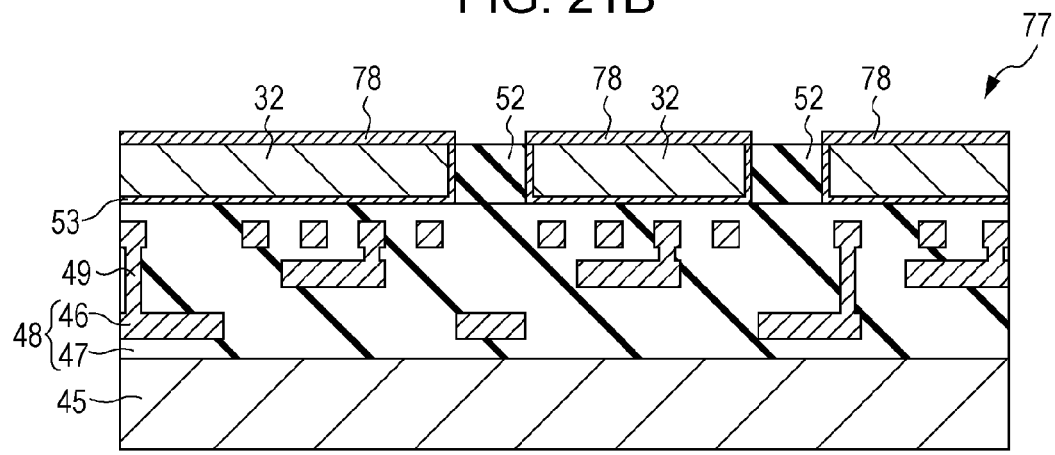
Figure 22:
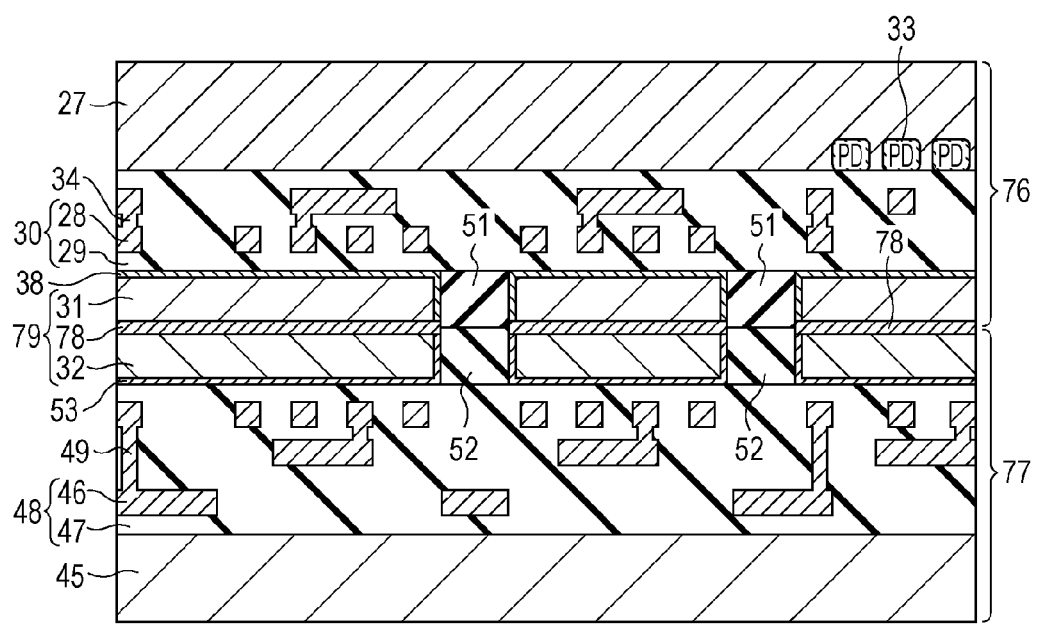
FIG. 22 is a process diagram illustrating the manufacturing method of the solid-state imaging device according to the fifth embodiment of the present disclosure.

In the present embodiment, in the imaging element 76 and the logic element 77, similarly to FIGS. 4A to 6B, after the first metal layer 31 and the second metal layer 32 are formed, as illustrated in FIG. 21B, the metal layer 78 having a low melting point is formed on the surface of the second metal layer 32 in the logic element 77. The metal layer 78 having a low melting point may be formed on any one of the laminated elements, and in the present embodiment, the metal layer 78 is not formed on the imaging element 76 as illustrated in FIG. 21A.

Materials of the metal layer 78 having a low melting point may be material including tin (Sn) or the like. For example, the materials may use Sn-0.7% Cu (melting point: 227° C.), Sn-3% Bi (melting point: 223° C.), Sn-3.5% Ag (melting point: 221° C.), Sn-9% Zn (melting point: 199° C.). For example, the metal layer having a low melting point may be formed by general plating methods.

After the metal layer 78 having a low melting point is formed on the logic element 77, as illustrated in FIG. 22, the imaging element 76 and the logic element 77 are laminated so that the first metal layer 31 and the second metal layer 32 are bonded to each other via the metal layer 78 having a low melting point. Thereby, the metal layer 78 having a low melting point, the first metal layer 31, and the second metal layer 32 are alloyed, and the imaging element 76 and the logic element 77 are bonded to each other.

In the present embodiment, since the metal layer 78 having a low melting point is formed on the bonding surface, higher connecting strength can be obtained at a lower temperature compared to the first embodiment. Thereafter, through processes similar to those of FIGS. 11 and 12, the solid-state imaging device of the present embodiment is completed.

Further in the solid-state imaging device of the present embodiment, effects similar to those of the first embodiment can be obtained.

6. Sixth Embodiment

MOS Type of Backside-Illuminated Solid-State Imaging Device

Next, a solid-state imaging device according to a sixth embodiment of the present disclosure will be described. The manufacturing method of the solid-state imaging device of the present embodiment is an example which is different to the manufacturing method of the first embodiment. However, since the completed cross-sectional configuration is similar to that of FIG. 3, the illustration is omitted. FIGS. 23A to 27 are process diagrams illustrating the manufacturing method of the solid-state imaging device of the present embodiment. In FIG. 23A to 27, the parts corresponding to those of FIG. 3 are denoted by the same reference numbers and the overlapping descriptions are omitted.

Figure 23A:
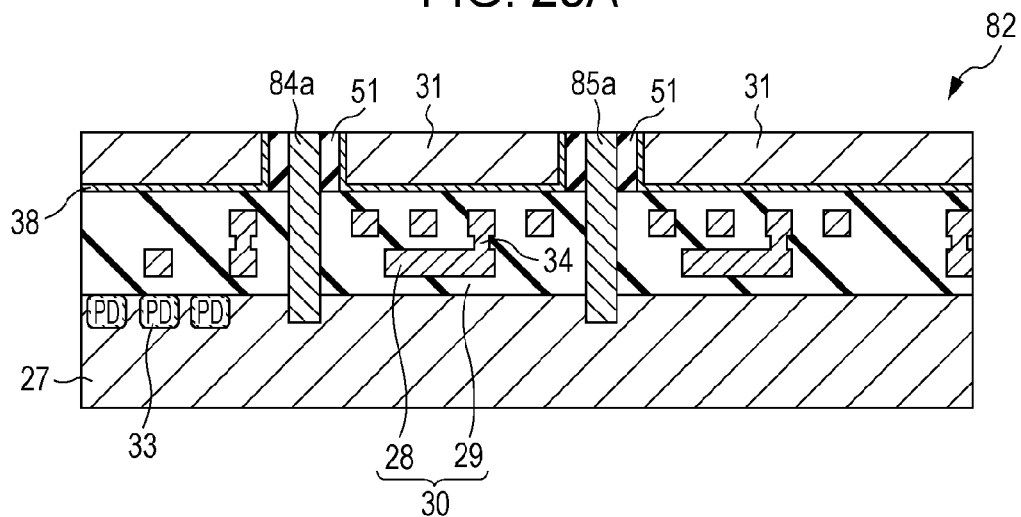
FIGS. 23A and 23B are process diagrams illustrating a manufacturing method of a solid-state imaging device according to a sixth embodiment of the present disclosure.

In an imaging element 82 and a logic element 83, similarly to FIGS. 4A to 6B, the first metal layer 31 and the second metal layer 32 are formed. Thereafter, as illustrated in FIG. 23A, in the imaging element 82, penetrating electrode layers 84*a* and 85*a* are formed from the surface of the first insulating portion 51 to a predetermined depth of the first semiconductor substrate 27. After penetrating holes are formed to a predetermined depth of the first semiconductor substrate 27, the inner peripheral surfaces of the penetrating holes are coated by an insulating film (not illustrated). Thereafter, an electrode material is embedded to the penetrating holes, and the penetrating electrode layers 84*a* and 85*a* are formed. Thereby, the penetrating electrode layers 84*a* and 85*a* and the first semiconductor substrate 27 are electrically insulated to each other. In addition, the penetrating electrode layers 84*a* and 85*b* are formed to the same depth as that in which the photoelectric conversion portion 33 is formed in the first semiconductor substrate 27.

Figure 23B:
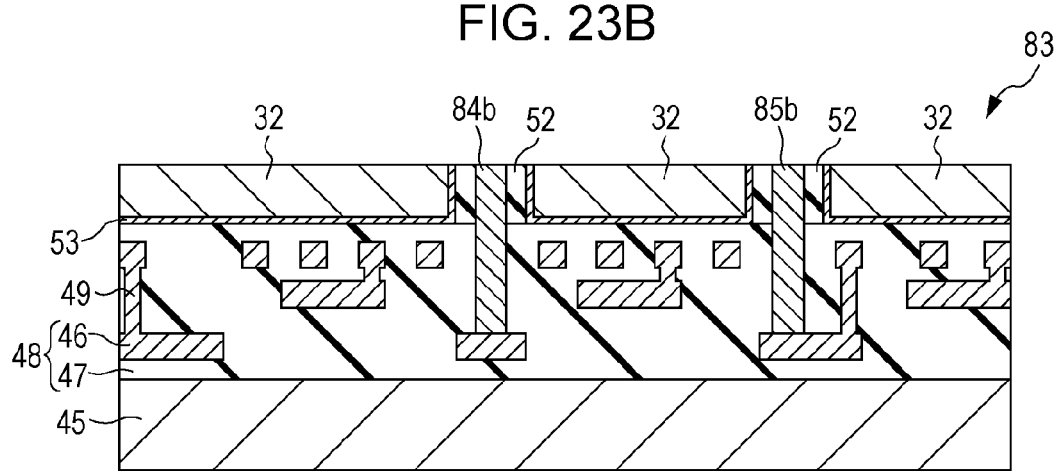

On the other hand, also in the logic element 83, as illustrated in FIG. 23B, penetrating electrode layers 84*b* and 85*b* are formed from the surface of the second insulating portion 52 to a predetermined wiring 46 of the second wiring layer 48. After penetrating holes are formed from the surface of the second insulating portion 52 to the predetermined wiring 46 of the second wiring layer 48, an electrode material is embedded to the penetrating holes, and the penetrating electrode layer 84*b* and 85*b* are formed.

Moreover, in the imaging element 82 and the logic element 83, after the penetrating electrode layers 84*a*, 85*a*, 84*b*, and 85*b* are formed, similarly to the process of FIGS. 8A and 8B, reductive plasma processing is performed with respect to the surfaces of the first metal layer 31 and the second metal layer 32.

Figure 24A:
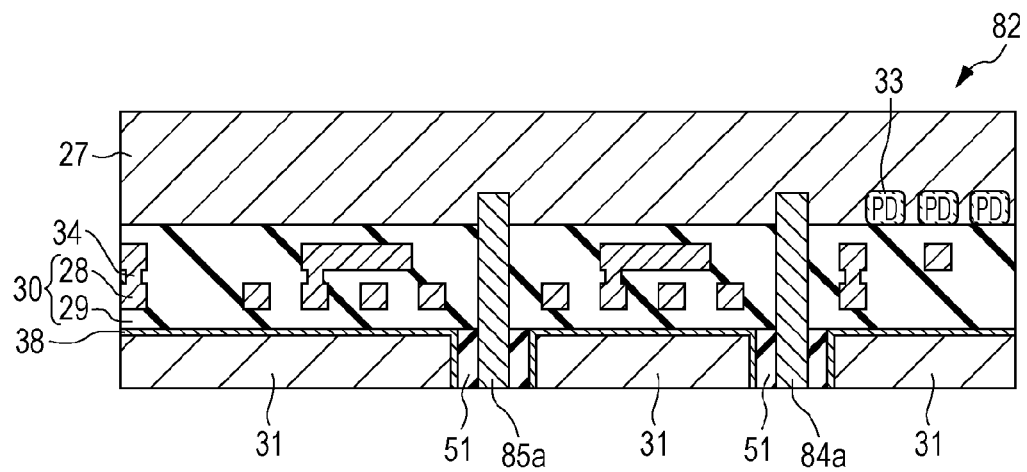
FIGS. 24A and 24B are process diagrams illustrating the manufacturing method of the solid-state imaging device according to the sixth embodiment of the present disclosure.
Figure 24B:
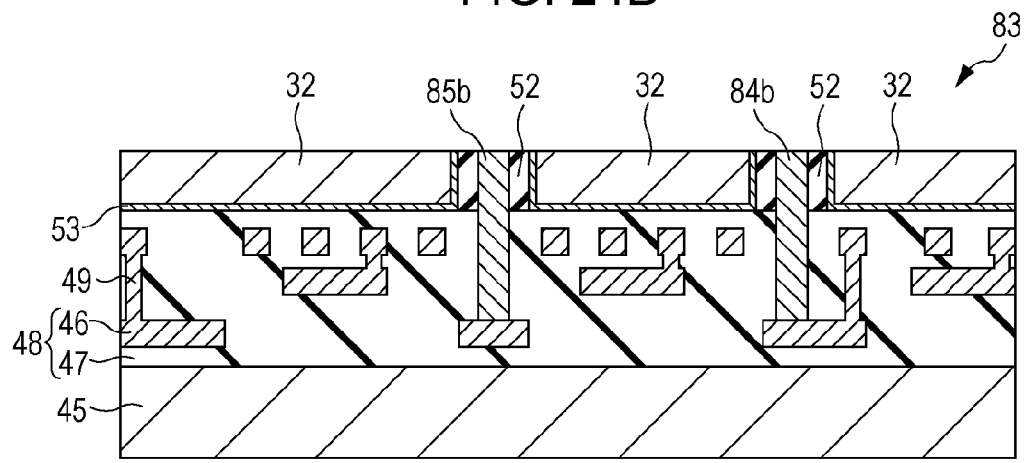
Figure 25:
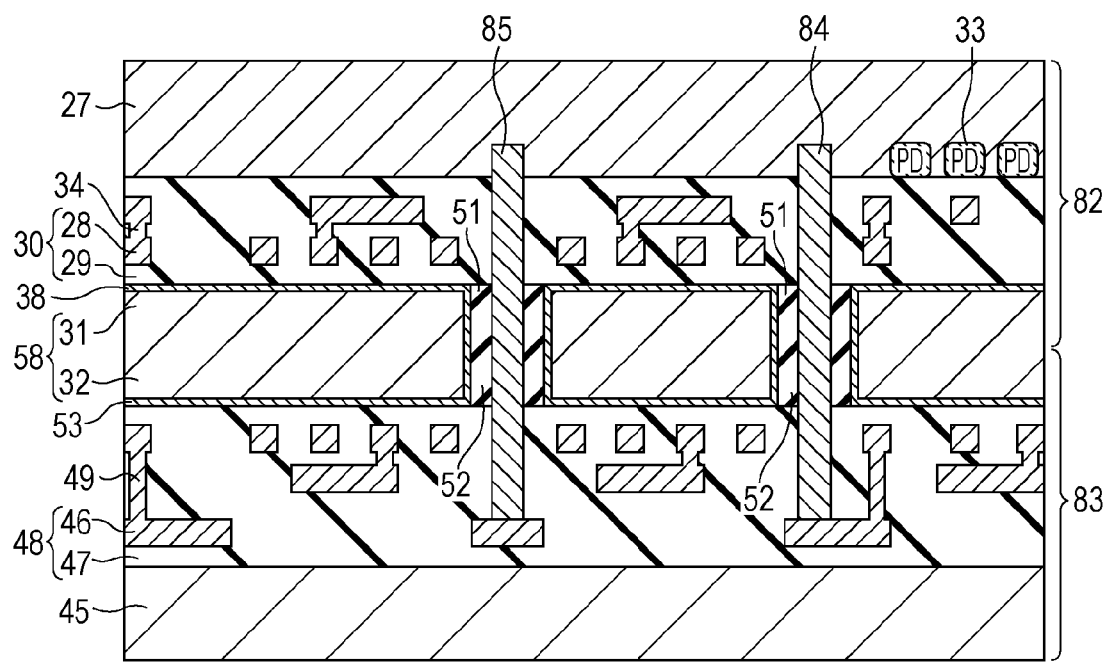
FIG. 25 is a process diagram illustrating the manufacturing method of the solid-state imaging device according to the sixth embodiment of the present disclosure.

Next, as illustrated in FIGS. 24A and 24B, the first metal layer 31 and the second metal layer 32, and the penetrating electrode layers 84*a* and 85*a* formed in the imaging element 82 and penetrating electrode layers 84*b* and 85*b* formed in the logic element 83 are aligned so as to be bonded respectively. Thereafter, as illustrated in FIG. 25, the imaging element 82 and the logic element 83 are bonded to each other so that the surface of the first metal layer 31 and the surface of the second metal layer 32 are bonding surfaces.

Next, due to the fact that annealing is performed by the same method as that of FIG. 10, the Cu to Cu bonding is achieved, and the first metal layer 31 and the second metal layer 32 are integrated. At this time, the first insulating portion 51 or the penetrating electrode layer 84a and 85a, which is exposed to the surface of the imaging element 82, is also bonded to the second insulating portion 52 or the penetrating electrode layers 84b and 85b which are exposed to the surface of the logic element 83. Moreover, due to the fact that the first metal layer 31 and the second metal layer 32 are integrated, the shield layer 58 is formed between the imaging element 82 and the logic element 83. In addition, due to the fact that the penetrating electrode layer 84a and the penetrating electrode layer 84b, and the penetrating electrode layer 85a and the penetrating electrode layer 85b are bonded respectively, the penetrating electrodes 84 and 85 which penetrate the bonding surface between elements are formed.

Figure 26:
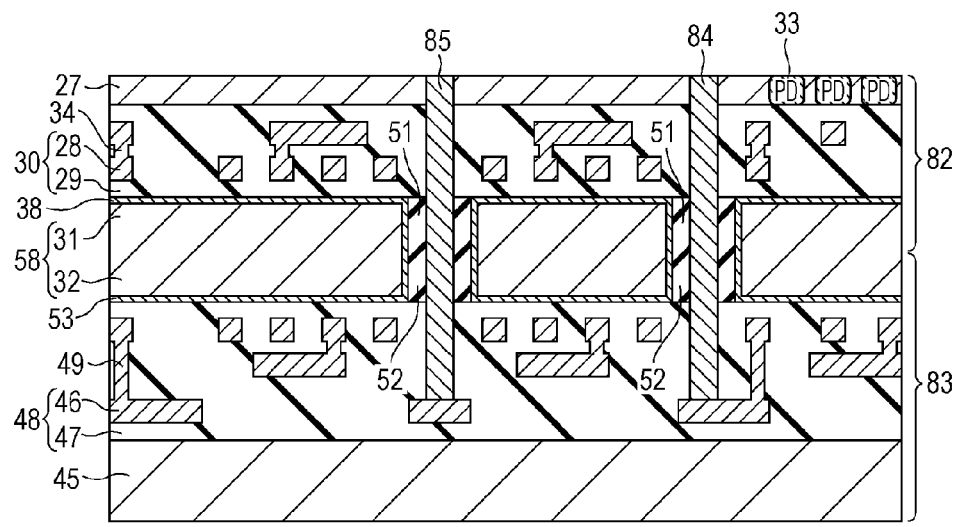
FIG. 26 is a process diagram illustrating the manufacturing method of the solid-state imaging device according to the sixth embodiment of the present disclosure.

Next, as illustrated in FIG. 26, through the same method as that of FIG. 11, the first semiconductor substrate 27 is thinned from the rear surface side, and the penetrating electrode layers 84 and 85 are exposed to the rear surface side of the first semiconductor substrate 27.

Figure 27:
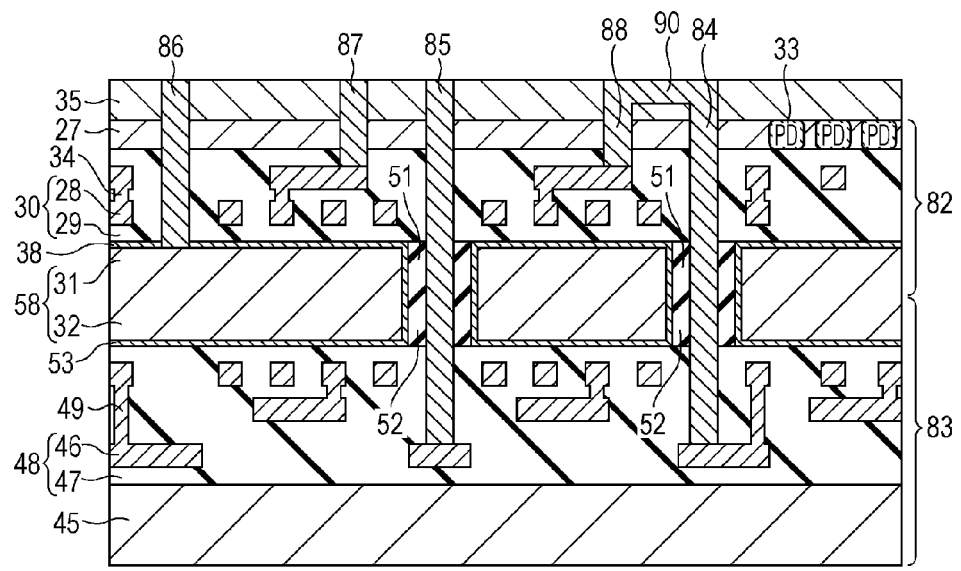
FIG. 27 is a process diagram illustrating the manufacturing method of the solid-state imaging device according to the sixth embodiment of the present disclosure.

Next, as illustrated in FIG. 27, the protective film 35 including SiN or SiCN is formed on the entire rear surface of the first semiconductor substrate 27. Thereafter, a penetrating electrode 86 connected to shield layer 58, and a penetrating electrode layers 87 and 88 connected to the wiring 28 of the first wiring layer 30 are formed from the surface of the protective film 35 respectively. In addition, a connective electrode portion 90, which connects the penetrating electrode layers 87 and 88 connected to the wiring 28 of the first wiring layer 30 and the penetrating electrode layers 84 and 85 connected to the wiring 46 of the second wiring layer 48, is formed.

After penetrating holes of a predetermined depth are formed, an insulating film (not illustrated) is formed so as to coat the inner peripheral surfaces of the penetrating holes. Thereafter, an electrode material is embedded to the penetrating holes, and the shield layer 58 and the penetrating electrode layers 87 and 88 connected to the wiring 28 of the first wiring layer 30 are formed.

Next, the color filter layer 36 is formed on the upper surface of the protective film 35, and the penetrating electrode layers 85, 86, and 87 are extracted to the surface of the color filter layer 36. In this case, grooves are formed from the surface of the color filter layer 36 so that each surface of the penetrating electrode layers 85, 86, and 87 is exposed, and an electrode material is embedded into the grooves. Thereby, the penetrating electrode layers 85, 86, and 87 which are exposed to the surface of the color filter 36 are formed.

Thereafter, the on-chip microlens 37 corresponding to each pixel is formed in the pixel region. Thereby, the solid-state imaging device similar to the solid-state imaging device illustrated in FIG. 3 is completed.

In the present embodiment, the penetrating electrode layers 84 and 85 which penetrate the bonding surface between the imaging element 82 and the logic element 83 are formed in the process before the bonding. Thereby, the aspect ratio of the penetrating hole can be small when the penetrating electrode layers 84 and 85 are formed, and void formation or the like can be prevented.

Further, effects similar to those of the first embodiment can be obtained.

7. Seventh Embodiment

MOS Type of Backside-Illuminated Solid-State Imaging Device

Figure 28:
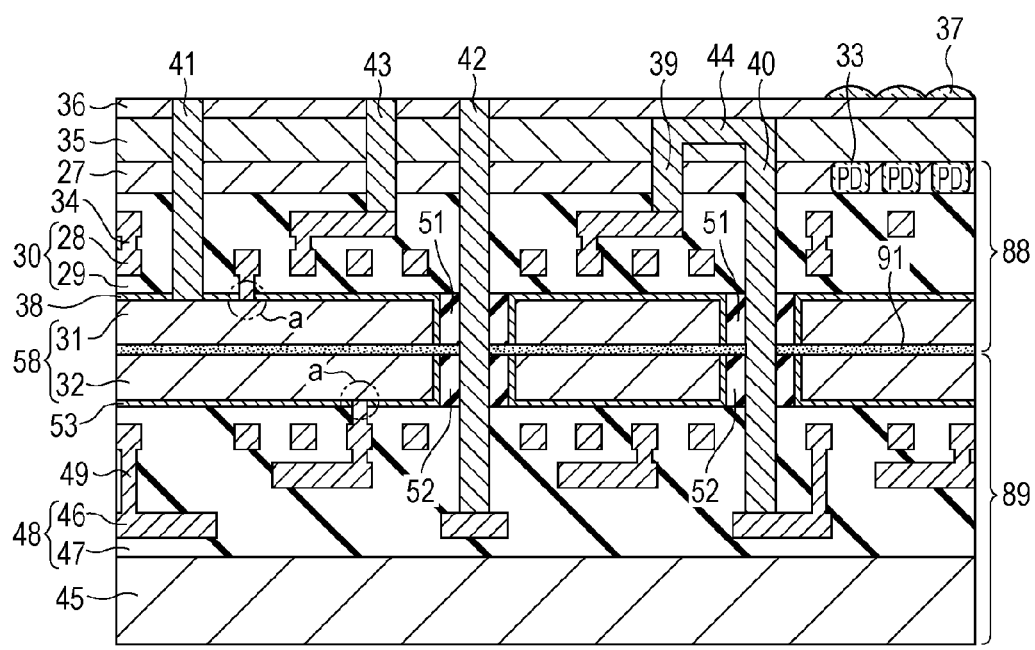
FIG. 28 is a diagram illustrating a cross-sectional configuration of a solid-state imaging device according to a seventh embodiment of the present disclosure.

Next, a solid-state imaging device according to a seventh embodiment of the present disclosure will be described. FIG. 28 is a configuration diagram illustrating the cross-section of the solid-state imaging device of the present embodiment. The present embodiment is an example which performs the bonding between the imaging element 82 and the logic element 83 by an adhesive layer 91. In FIG. 28, the parts corresponding to those of FIG. 3 denoted by the same reference numbers and the overlapping descriptions are omitted.

As illustrated in FIG. 28, in the solid-state imaging device of the present embodiment, the imaging element 88 and the logic element 89 are bonded to each other by the adhesive layer 91. For example, the adhesive layer 91 may use BCB (benzocyclobutene). In the solid-state imaging device of the present embodiment, in the bonding process of FIG. 9, the adhesive layer 91 is formed on the bonding surface of the imaging element 88 or the logic element 89, and both may be bonded to each other. In this way, since the adhesive agent is used for the bonding between the imaging element 88 and the logic element 89, metal to metal bonding is not used. Therefore, the annealing processing or the like illustrated in FIG. 10 is not necessary.

Further, effects similar to those of the first embodiment can be obtained.

In addition, in the present embodiment, the first metal layer 31 and the second metal layer 32 included in the shield layer 58 are not electrically connected to each other. Therefore, the wiring 28 is constituted so as to be connected to the first metal layer 31 as illustrated with a region a in the imaging element 88, and the wiring 46 is constituted so as to be connected to the second metal layer 32 as illustrated with a region a in the logic element 89. Moreover, ground potential is supplied to the first metal layer 31 and the second metal layer 32 respectively.

8. Eighth Embodiment

MOS Type of Backside-Illuminated Solid-State Imaging Device

Figure 29:
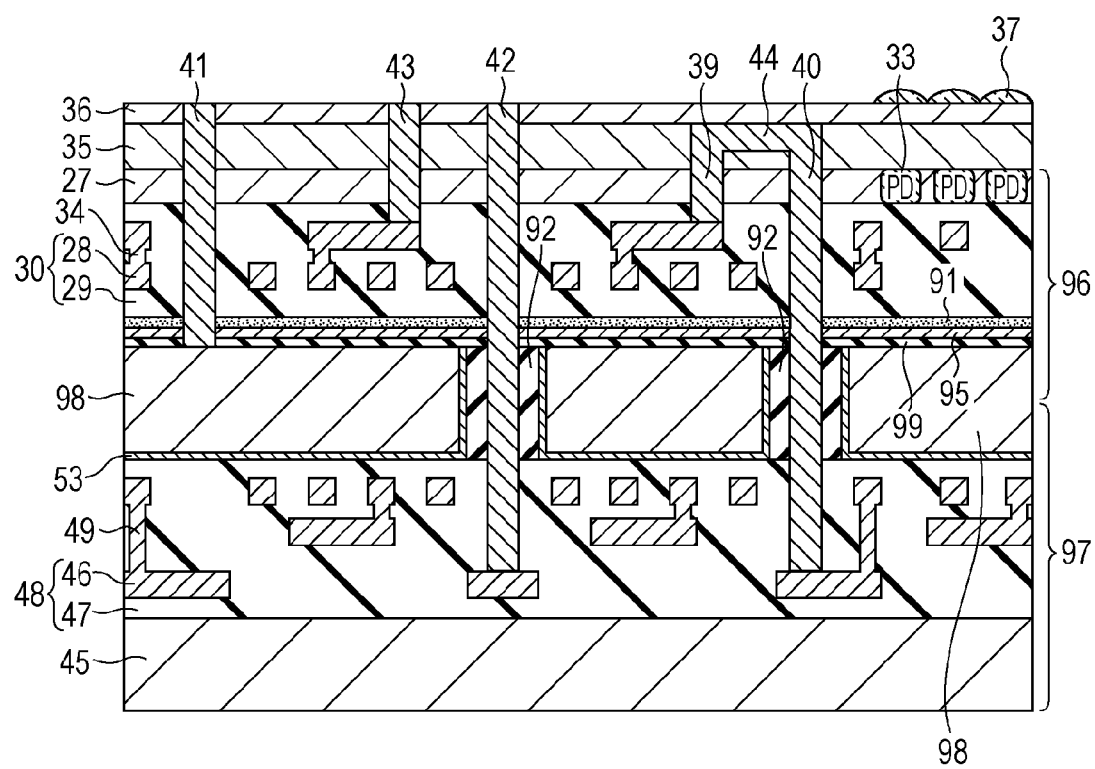
FIG. 29 is a diagram illustrating a cross-sectional configuration of a solid-state imaging device according to an eighth embodiment of the present disclosure.
Figure 30A:
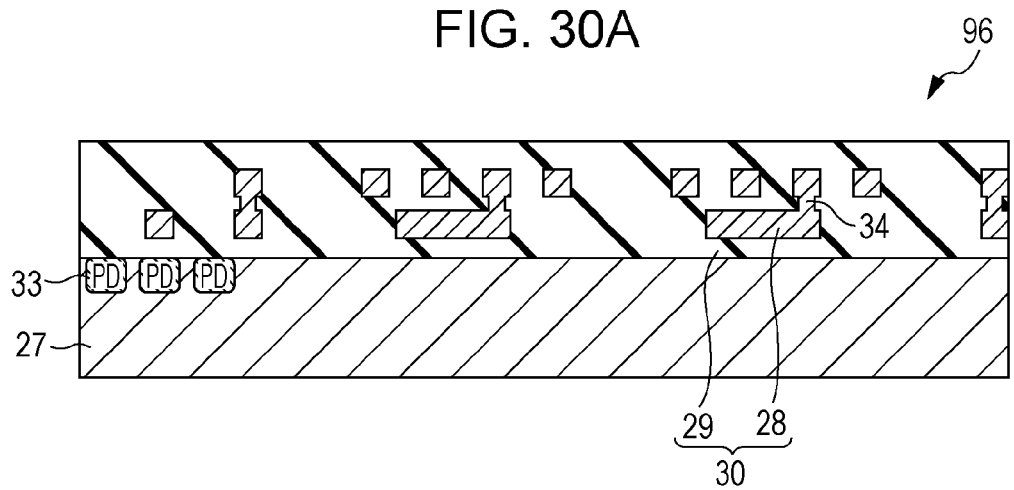
FIGS. 30A and 30B are process diagrams illustrating the manufacturing method of the solid-state imaging device according to an eighth embodiment of the present disclosure.
Figure 30B:
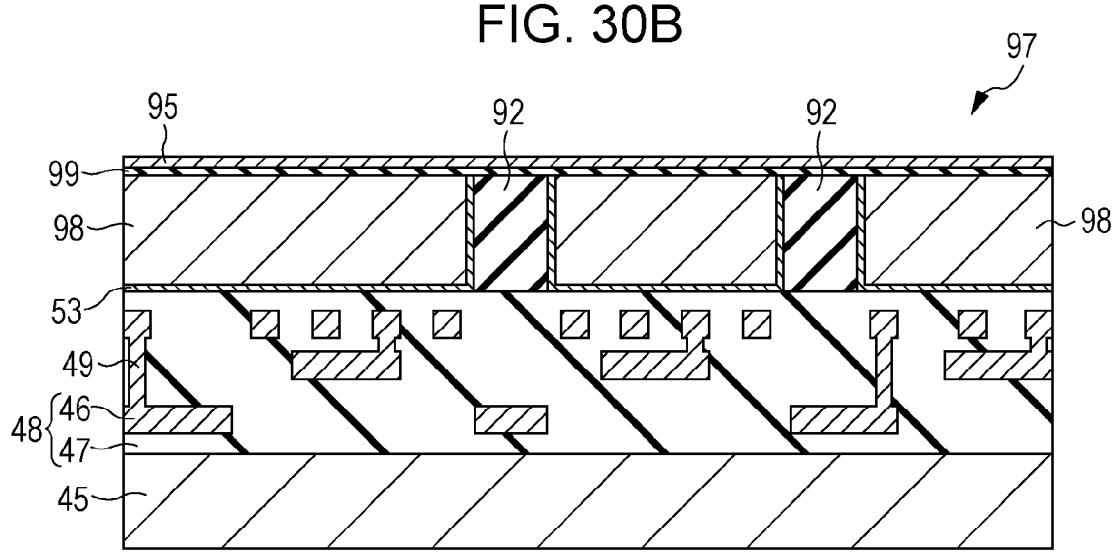
Figure 31:
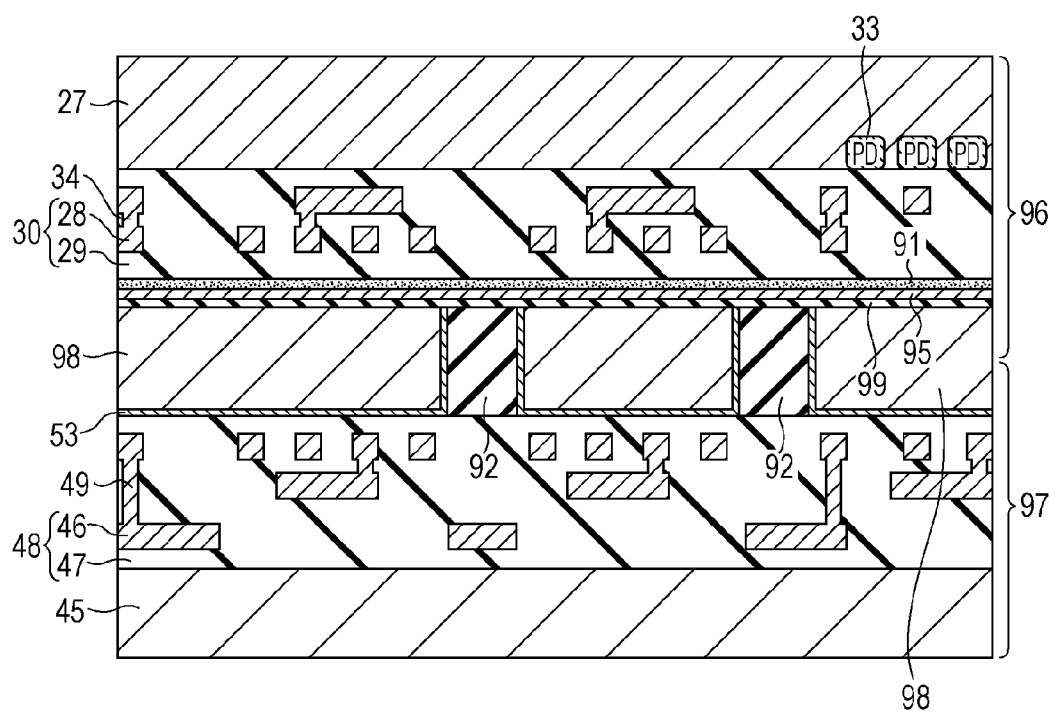
FIG. 31 is a process diagram illustrating the manufacturing method of the solid-state imaging device according to the eighth embodiment of the present disclosure.

Next, a solid-state imaging device according to an eighth embodiment of the present disclosure will be described. FIG. 29 is a configuration diagram illustrating the cross-section of the solid-state imaging device of the present embodiment. The present embodiment is an example in which the shield layer is formed on only the logic element, and the logic element including the shield layer and the imaging element are bonded to each other. FIGS. 30A to 31 are process diagrams illustrating a manufacturing method of the solid-state imaging device of the present embodiment, and in FIGS. 29 to 31, the parts corresponding to those of FIG. 3 denoted by the same reference numbers and the overlapping descriptions are omitted.

As illustrated in FIG. 30A, in an imaging element 96, similarly to the first embodiment, the first wiring layer 30 is formed on the upper portion of the first semiconductor substrate 27. On the other hand, in a logic element 97, as illustrated in FIG. 30B, after the second wiring layer 48 is formed on the upper portion of the second semiconductor substrate 45, a shield layer 98 and an insulating portion 92 are formed on the upper portion of the second wiring layer 48 similarly to the processes illustrated in FIGS. 4A to 7B of the first embodiment. For example, the shield layer 98, which is formed on the upper portion of the second wiring layer 48, is formed to the same thickness as that of the shield layer of the first embodiment. In addition, the shield layer 98 is formed on the upper portion of the second wiring 48 via the barrier metal layer 53. In addition, a cap interlayer film 99 including SiN, SiC, SiCN, or the like is formed on the entire surface including the shield layer 98 and the insulating portion 92, and an antireflective film 95 is formed on the cap interlayer film 99.

Moreover, as illustrated in FIG. 31, after the adhesive layer 91 including BCB is formed on the bonding surface of either the logic element 97 or the imaging element 96, the imaging element 96 and the logic element 97 are bonded to each other. At this time, for example, due to the fact that annealing processing is performed at about 300° C., the bonding strength can be enhanced.

Thereafter, through the same processes as those of the first embodiment, the solid-state imaging device of the present embodiment illustrated in FIG. 29 can be completed. The present embodiment can obtain the same effects as those of the first embodiment. In addition, in FIG. 29, although not illustrated, in the solid-state imaging device of the present embodiment, a ground wiring in the second wiring layer 48 of the logic element 97 side can be connected to the shield layer 98 by using the penetrating electrode layers 39 and 40.

In the first to eighth embodiments described above, examples of the solid-state imaging devices which can obtain by laminating the imaging element and the logic element are described. However, the above-described embodiments of the present disclosure can be applied to a semiconductor device which laminates LSI elements including a desired function. In this case, the first metal layer is formed on a first semiconductor element including a first semiconductor integrated circuit, the second metal layer is formed on a second semiconductor element including a second semiconductor integrated circuit, and the first and second semiconductors are laminated so that the first metal layer and the second metal layer are bonded to each other. Thereby, a shield layer including the first metal layer and the second metal layer can be constituted between the first semiconductor element and the second semiconductor element which are laminated to each other. Therefore, influence of electromagnetic waves or a problem of crosstalk which are generated due to operation of mutual elements can be decreased by the shield layer.

The application of the present disclosure is not limited to the solid-state imaging device which detects the distribution of the incident light amount of the visible light and images the distribution as the image. That is, the present disclosure may be also applied to a solid-state imaging device which images the distribution of the incident amount of infrared light, X rays, particles and the like as the image. In addition, in a broad sense, the present disclosure may be applied to the entire solid-state imaging device including a solid-state imaging device (a physical quantity distribution detecting device) such as a fingerprint detection sensor which detects distribution of other physical quantities, such as pressure or electrostatic capacity, and images them as the images.

In addition, the present disclosure is not limited to the solid-state imaging device which scans each unit pixel of the pixel portion in order by row unit and reads the pixel signal from each unit pixel. The present disclosure may be applied to a solid-state imaging device of an X-Y address type which selects arbitrary pixels by pixel unit and reads the signals from the selected pixels by pixel unit.

In addition, the solid-state imaging device may be a configuration formed on one chip, or a configuration of a modular form having an imaging function which collects the pixel portion, the signal processing portion, or the optical system and packages them.

In addition, the present disclosure is not limited to application to the solid-state imaging device, and may be also applied to imaging devices. Here, the imaging device means camera systems such as a digital still camera or a video camera, or electronic apparatuses including imaging function such as a mobile phone. Moreover, the imaging device includes an imaging device having the configuration of the modular form mounted on the electronic apparatus, that is, a camera module.

9. Ninth Embodiment

Electronic Apparatus

Figure 32:
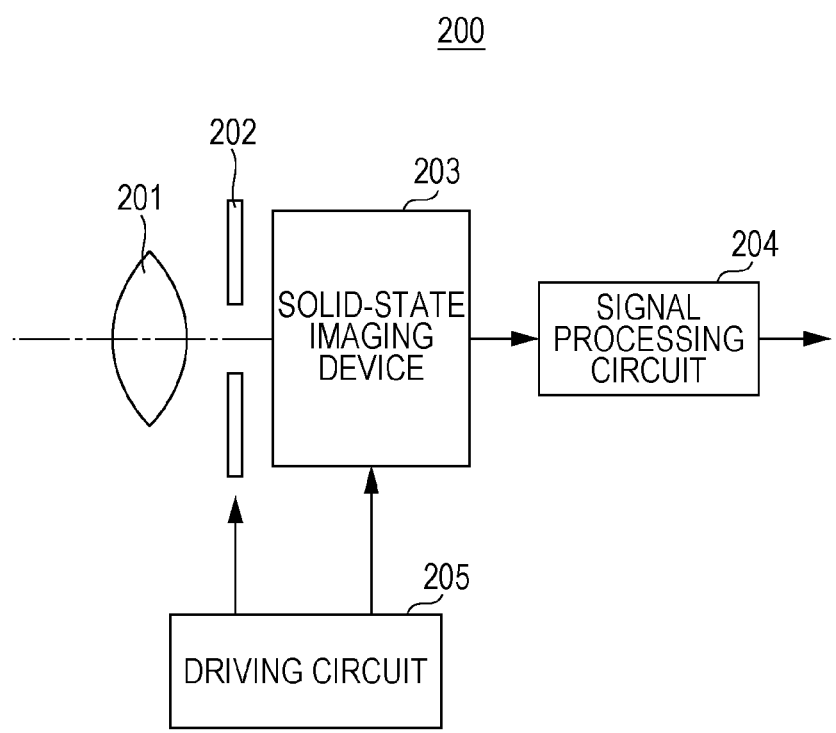
FIG. 32 is a diagram illustrating a configuration of an electronic apparatus according to a ninth embodiment of the present disclosure.

Next, an electronic apparatus according to a ninth embodiment of the present disclosure will be described. FIG. 32 is a schematic configuration diagram illustrating the electronic apparatus 200 according to the ninth embodiment of the present disclosure.

The electronic apparatus 200 of the present embodiment is an embodiment in the case where the solid-state imaging device 1 of the above-described first embodiment of the present disclosure is used in the electronic apparatus (camera).

The electronic apparatus 200 according to the present embodiment includes the solid-state imaging device 203, an optical lens 201, a shutter unit 202, a driving circuit 205, and a signal processing circuit 204.

The optical lens 201 images an image light (incident light) from subject on the imaging surface of the solid-state imaging device 203. Thereby, the signal charge is stored in the solid-state imaging device 203 for a predetermined interval. The shutter unit 202 controls the light irradiation interval and the light shield interval into the solid-state imaging device 203.

The driving circuit 205 supplies the driving signal which controls the transfer operation of the solid-state imaging device 203 and the shuttering operation of the shutter unit 202. The signal transfer of the solid-state imaging device 203 is performed by the driving signal (timing signal) supplied from the driving circuit 205. The signal processing circuit 204 performs a variety of signal processings. The image signal which is subjected to the signal processing is stored on the storage medium, such as memory, or output to a monitor.

In the electronic apparatus 200 of the present embodiment, since influence of electromagnetic waves or influence of crosstalk between the logic circuit laminated at the lower layer and the imaging element laminated at upper layer in the solid-state imaging device 203 is decreased, image quality of the electronic apparatus is improved.

The electronic apparatus 200 to which the solid-state imaging device 203 can be applied is not limited to a camera. That is, the electronic apparatus 200 can be applied to an imaging device such as a digital still camera and a camera module for a mobile device in a mobile phone or the like.

The present disclosure contains subject matter related to that disclosed in Japanese Priority Patent Application JP 2010-241491 filed in the Japan Patent Office on Oct. 27, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A solid-state imaging device comprising:
an imaging element that includes a first semiconductor substrate, a first wiring layer that is formed on a surface of the first semiconductor substrate, and a first metal layer that is formed on an upper portion of the first wiring layer, in which a pixel region which is a light sensing surface is formed on a rear surface side of the first semiconductor substrate; and
a logic element that includes a second semiconductor substrate, a second wiring layer that is formed on a surface of the second semiconductor substrate, and a second metal layer that is formed on an upper portion of the second wiring layer, a signal processing circuit that processes a pixel signal obtained at the pixel region is formed in the logic element, and the logic element is laminated to the imaging element so that the first metal layer and the second metal layer are bonded to each other,
wherein,
the first metal layer and the second metal layer are formed on a region excluding a region in which a penetrating electrode layer penetrating a bonding surface of the imaging element and the logic element is formed, and
the first metal layer and the second metal layer are connected to ground potential.

2. The solid-state imaging device according to claim 1, further comprising:
a first insulating portion including an insulating material that is formed on a predetermined region of the same layer as the first metal layer;
a second insulating portion including an insulating material that is formed on a region which contacts the first insulating portion in a predetermined region of the same layer as the second metal layer; and
a penetrating electrode layer that penetrates the first insulating portion and the second insulating portion.

3. The solid-state imaging device according to claim 2, wherein the penetrating electrode layer is exposed to a light sensing surface side of the imaging element.

4. The solid-state imaging device according to claim 1, wherein the first metal layer and/or the second metal layer is a laminated structure including different metal materials.

5. The solid-state imaging device according to claim 1, wherein the first metal layer is formed on an upper portion of the first wiring layer via a barrier metal layer including ferromagnetic.

6. The solid-state imaging device according to claim 1, wherein the second metal layer is formed on an upper portion of the second wiring layer via a barrier metal layer including a ferromagnetic body.

7. A method of manufacturing a solid-state imaging device comprising:
forming a first wiring layer on a surface of a first semiconductor substrate, forming a first metal layer in which a surface is exposed on an upper portion of the first wiring layer, and forming an imaging element including a pixel region;
forming a second wiring layer on a surface of a second semiconductor substrate, forming a second metal layer in which a surface is exposed on an upper portion of the second wiring layer, and forming a logic element having a signal processing circuit which processes a signal charge generated at the pixel region;
laminating the imaging element and the logic element so that the first metal layer and the second metal layer are bonded to each other;
forming a convex first insulating portion on a predetermined region of an upper portion of the first wiring layer on the first semiconductor substrate before forming the first metal layer;
forming the first metal layer by embedding a metal material so as to be the same height as the surface of the first insulating portion on an upper portion of the first wiring layer in which the first insulating portion is not formed after forming the first insulating portion;
forming a convex second insulating portion on a predetermined region of an upper portion of the second wiring layer on the second semiconductor substrate before forming the second metal layer;
forming the second metal layer by embedding a metal material so as to be the same height as the surface of the second insulating portion on an upper portion of the second wiring layer in which the second insulating portion is not formed after forming the second insulating portion; and
laminating the imaging element and the logic element so that the first metal layer and the second metal layer are bonded to each other and the first insulating portion and the second insulating portion are bonded to each other when the imaging element and the logic element are laminated,
wherein,
the first metal layer and the second metal layer are formed on a region excluding a region in which a penetrating electrode layer penetrating a bonding surface of the imaging element and the logic element is formed.

8. The method of claim 7, further comprising:
forming a penetrating electrode layer which penetrates the first insulating portion and the second insulating portion from a surface of the imaging element or the logic element after laminating the imaging element and the logic element.

9. The method of claim 7, further comprising:
forming a penetrating electrode layer which penetrates to a predetermined depth from a surface of the first insulating portion in the imaging element before laminating the imaging element and the logic element;
forming a penetrating electrode layer which penetrates to a predetermined depth from a surface of the second insulating portion in the logic element; and
connecting a penetrating electrode layer formed on the imaging element and a penetrating electrode layer formed on the logic element when laminating the imaging element and the logic element.

10. The method of claim 7, wherein the first metal layer and the second metal layer are formed by an electrolytic plating method.

11. A method of manufacturing a semiconductor device comprising:
forming a first wiring layer on a surface of a first semiconductor substrate, forming a first metal layer in which a surface is exposed on an upper portion of the first wiring layer, and forming a first semiconductor element including a first semiconductor integrated circuit;
forming a second wiring layer on a surface of a second semiconductor substrate, forming a second metal layer in which a surface is exposed on an upper portion of the second wiring layer, and forming a second semiconductor element including a second semiconductor integrated circuit; and
laminating the first semiconductor element and the second semiconductor element so that the first metal layer and the second metal layer are bonded to each other;
forming a convex first insulating portion on a predetermined region of an upper portion of the first wiring layer on the first semiconductor substrate before forming the first metal layer;

forming the first metal layer by embedding a metal material so as to be the same height as the surface of the first insulating portion on an upper portion of the first wiring layer in which the first insulating portion is not formed after forming the first insulating portion;

forming a convex second insulating portion on a predetermined region of an upper portion of the second wiring layer on the second semiconductor substrate before forming the second metal layer;

forming the second metal layer by embedding a metal material so as to be the same height as the surface of the second insulating portion on an upper portion of the second wiring layer in which the second insulating portion is not formed after forming the second insulating portion; and laminating the first semiconductor element and the second semiconductor element so that the first metal layer and the second metal layer are bonded to each other and the first insulating portion and the second insulating portion are bonded to each other when the first semiconductor element and the second semiconductor element are laminate, wherein, the first metal layer and the second metal layer are formed on a region excluding a region in which a penetrating electrode layer penetrating a bonding surface of the first semiconductor element and the second semiconductor is formed.

12. The method of claim 11, further comprising:
forming a penetrating electrode layer which penetrates the first insulating portion and the second insulating portion from a surface of the first semiconductor element or the second semiconductor element after laminating the first semiconductor element and the second semiconductor element.

13. The method of claim 11, further comprising:
forming a penetrating electrode layer which penetrates to a predetermined depth from a surface of the first insulating portion in the first semiconductor element before laminating the first semiconductor element and the second semiconductor element;

forming a penetrating electrode layer which penetrates to a predetermined depth from a surface of the second insulating portion in the second semiconductor element; and connecting a penetrating electrode layer formed on the first semiconductor element and a penetrating electrode layer formed on the second semiconductor element when laminating the first semiconductor element and the second semiconductor element.

14. The method of claim 11, wherein the first metal layer and the second metal layer are formed by an electrolytic plating method.

15. An electronic apparatus comprising:
an optical lens;
a solid-state imaging device into which light is focused to the optical lens is incident; and
a signal processing circuit that processes an output signal output from the solid-state imaging device,
wherein,
the solid-state imaging device includes an imaging element that includes a first semiconductor substrate, a first wiring layer that is formed on a surface of the first semiconductor substrate, and a first metal layer that is formed on an upper portion of the first wiring layer, in which a pixel region which is a light sensing surface is formed on a rear surface side of the first semiconductor substrate, and a logic element that includes a second semiconductor substrate, a second wiring layer that is formed on a surface of the second semiconductor substrate, and a second metal layer that is formed on an upper portion of the second wiring layer, a signal processing circuit that processes a pixel signal obtained at the pixel region is formed in the logic element, and the logic element is laminated to the imaging element so that the first metal layer and the second metal layer are bonded to each other, in which the first metal layer and the second metal layer are formed on a region excluding a region in which a penetrating electrode layer penetrating a bonding surface of the imaging element and the logic element is formed, and
the first metal layer and the second metal layer are connected to ground potential.

16. The electronic device of claim 15, further comprising:
a first insulating portion including an insulating material that is formed on a predetermined region of the same layer as the first metal layer;
a second insulating portion including an insulating material that is formed on a region which contacts the first insulating portion in a predetermined region of the same layer as the second metal layer; and
a penetrating electrode layer that penetrates the first insulating portion and the second insulating portion.

17. The electronic device of claim 16, wherein the penetrating electrode layer is exposed to a light sensing surface side of the imaging element.

18. The electronic device of claim 15, wherein the first metal layer and/or the second metal layer is a laminated structure including different metal materials.

19. The electronic device of claim 15, wherein the first metal layer is formed on an upper portion of the first wiring layer via a barrier metal layer including ferromagnetic.

20. The electronic device of claim 15, wherein the second metal layer is formed on an upper portion of the second wiring layer via a barrier metal layer including a ferromagnetic body.

* * * * *